(12) United States Patent  (10) Patent No.: US 11,951,722 B2
Hwang et al.  (45) Date of Patent: Apr. 9, 2024

(54) DISPLAY DEVICE AND METHOD FOR FABRICATING DISPLAY DEVICE

(71) Applicant: Samsung Display Co., LTD., Yongin-si (KR)

(72) Inventors: Dae Hyun Hwang, Seoul (KR); Won Ju Kim, Asan-si (KR); Do Hyung Ryu, Yongin-si (KR); Wu Hyeon Jung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 240 days.

(21) Appl. No.: 17/318,106

(22) Filed: May 12, 2021

(65) Prior Publication Data

US 2021/0378107 A1    Dec. 2, 2021

(30) Foreign Application Priority Data

May 29, 2020   (KR) .................. 10-2020-0065230

(51) Int. Cl.

| | |
|---|---|
| *B32B 3/10* | (2006.01) |
| *B32B 3/02* | (2006.01) |
| *H05K 7/20* | (2006.01) |
| *B32B 3/04* | (2006.01) |
| *B32B 5/18* | (2006.01) |
| *B32B 27/06* | (2006.01) |

(52) U.S. Cl.
CPC ........... *B32B 3/02* (2013.01); *H05K 7/20954* (2013.01); *B32B 3/04* (2013.01); *B32B 5/18* (2013.01); *B32B 27/065* (2013.01); *B32B 2307/302* (2013.01); *B32B 2307/4023* (2013.01); *B32B 2457/20* (2013.01)

(58) Field of Classification Search
None
See application file for complete search history.

(56) References Cited

U.S. PATENT DOCUMENTS

2015/0331444 A1* 11/2015 Rappoport ............ G06F 1/1601
                                                       362/249.02

FOREIGN PATENT DOCUMENTS

| JP | 2003066438 A | * | 3/2003 | |
|---|---|---|---|---|
| KR | 1020150061144 A | | 6/2015 | |
| KR | 1020150108480 A | | 9/2015 | |
| KR | 2018098066 A | * | 9/2018 | ............... G06F 1/16 |
| KR | 1020190007578 A | | 1/2019 | |
| KR | 1020190048986 A | | 5/2019 | |
| KR | 1020200008679 A | | 1/2020 | |

OTHER PUBLICATIONS

Machine translation of KR-2018098066-A (Year: 2018).*
Machine translation of JP-2003066438-A (Year: 2003).*

* cited by examiner

*Primary Examiner* — Christopher M Polley
(74) *Attorney, Agent, or Firm* — CANTOR COLBURN LLP

(57) ABSTRACT

A display device includes a display panel comprises a display area and a non-display area surrounding the display area; a cover panel disposed on a rear surface of the display panel and comprising a front surface, a first side surface connected to the front surface and bent along a first bending line, a second side surface connected to the front surface and bent along a second bending line intersecting the first bending line, and a first corner located between the first side surface and the second side surface; and an alignment notch defined at the first corner of the cover panel.

18 Claims, 28 Drawing Sheets

200: SUB, TFTL, EML, TFE, SENL

DISPLAY DEVICE AND METHOD FOR FABRICATING DISPLAY DEVICE

This application claims priority to Korean Patent Application No. 10-2020-0065230, filed on May 29, 2020, and all the benefits accruing therefrom under 35 U.S.C. § 119, the content of which in their entirety are herein incorporated by reference.

BACKGROUND

1. Field of the Disclosure

The present disclosure relates to a display device, and a method of fabricating the same.

2. Description of the Related Art

A display device becomes more and more important as multimedia technology evolves. Accordingly, a variety of types of the display device such as liquid-crystal display ("LCD") devices and organic light-emitting display ("OLED") devices are currently used.

The display device may include a display panel displaying images and a window attached to the display panel. To attach the display panel and the window together, they may be aligned by using alignment marks indicated in both of them.

Firstly, vision cameras recognize alignment marks formed in both of the display panel and the cover panel. Then, the positions of the display panel and the cover panel can be determined based on the recognized positions or shapes of the alignment marks. Then, one of the display panel and the cover panel may be transferred toward the other, so that the display panel and the cover panel can be attached together.

Incidentally, as the display device is employed by various electronic devices, the display device is required to have various designs. For example, research is ongoing into a display device that can display images not only in the front face but also in the side faces extended from the front face.

SUMMARY

Aspects of the present disclosure provide a display device that allows identification marks for alignment to be easily recognized during a process of assembling a display panel and a cover panel, and a method for fabricating a display device.

It should be noted that objects of the present disclosure are not limited to the above-mentioned object; and other objects of the present disclosure will be apparent to those skilled in the art from the following descriptions.

An embodiment of a display device includes a display panel comprises a display area and a non-display area surrounding the display area; a cover panel disposed on a rear surface of the display panel and comprising a front surface, a first side surface connected to the front surface and bent along a first bending line, a second side surface connected to the front surface and bent along a second bending line intersecting the first bending line, and a first corner located between the first side surface and the second side surface; and an alignment notch defined at the first corner of the cover panel.

An embodiment of a method of fabricating a display device includes preparing a cover panel comprising a front surface, a first side surface connected to the front surface and bent along a first bending line, a second side surface connected to the front surface and bent along a second bending line intersecting the first bending line; recognizing, by a detector, an alignment notch defined at a corner of the cover panel between the first side surface and the second side surface of the cover panel; aligning the cover panel; and assembling the cover panel and the display panel.

According to an embodiment of the present disclosure, identification marks for alignment can be easily recognized during a process of assembling a display panel and a cover panel.

According to another embodiment of the present disclosure, it is possible to reduce distortion of alignment marks.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Hereinafter, embodiments of the present disclosure will be described with reference to the accompanying drawings. It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 1:
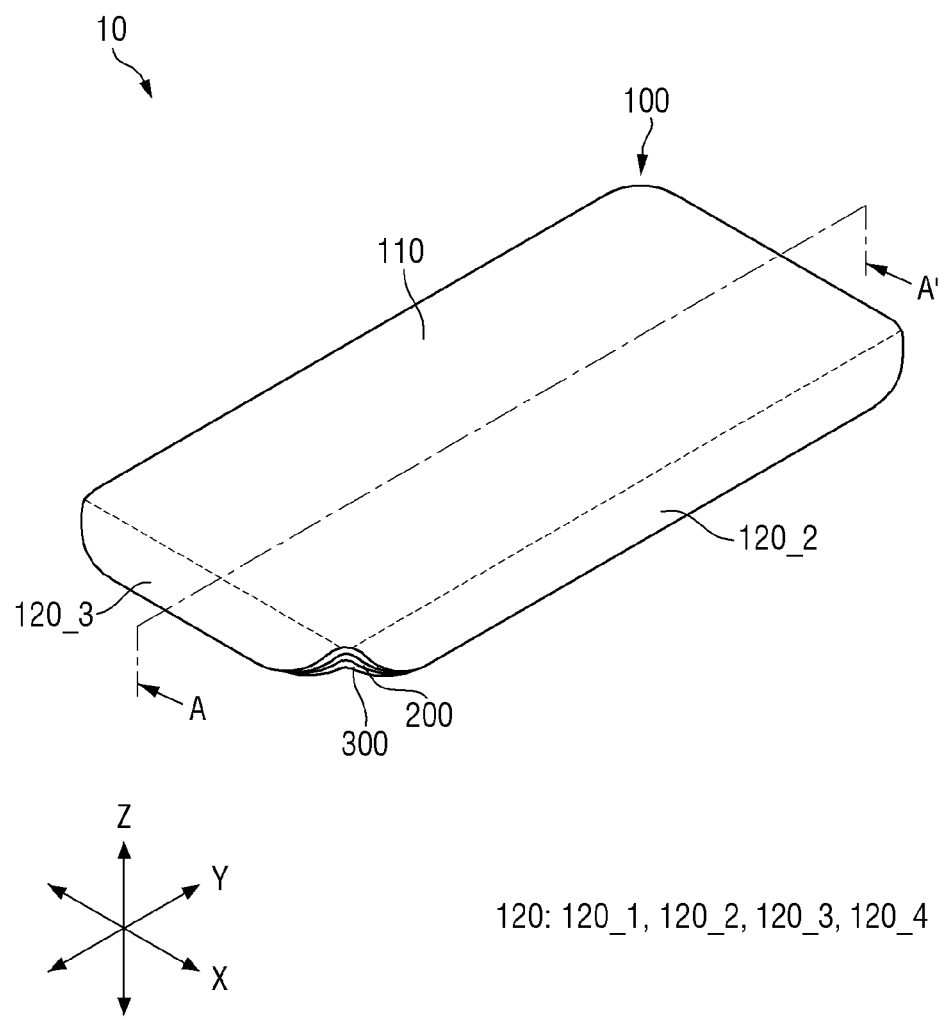
FIG. 1 is a perspective view showing a display device according to an embodiment of the present disclosure.
Figure 2:
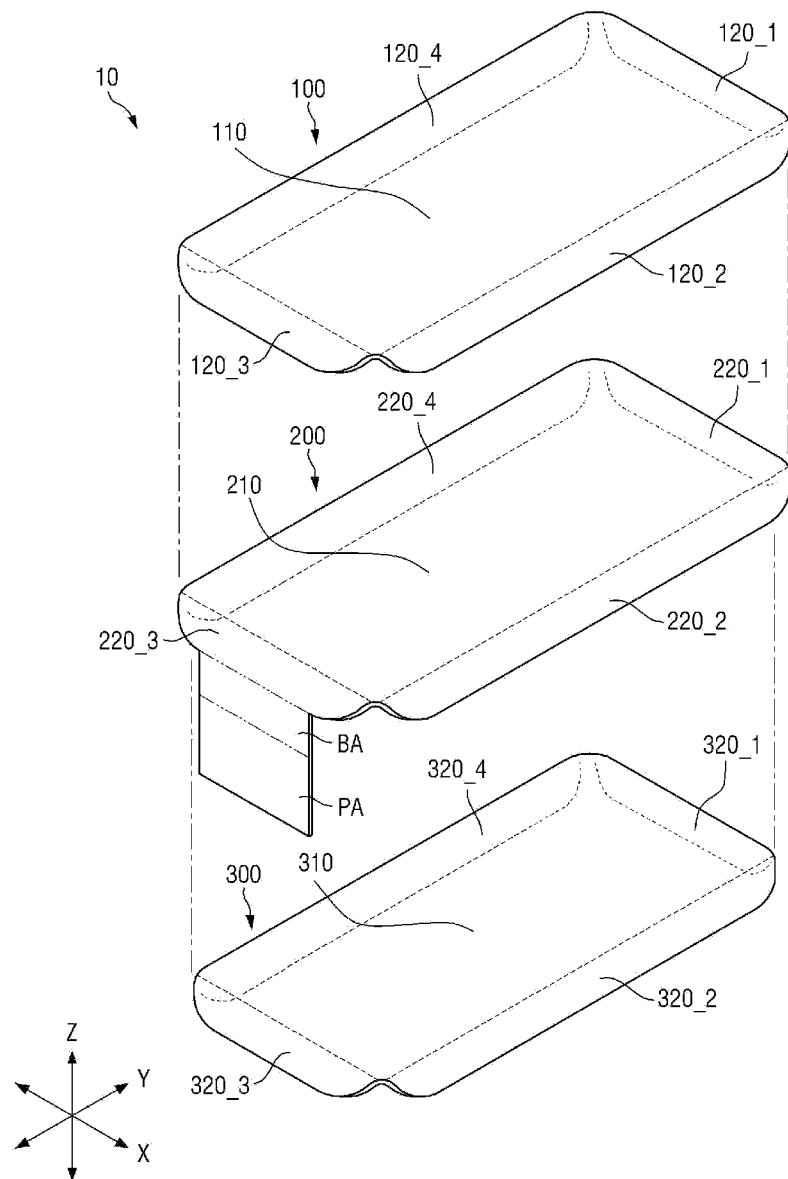
FIG. 2 is an exploded, perspective view of a display device according to an embodiment of the present disclosure.
Figure 3:
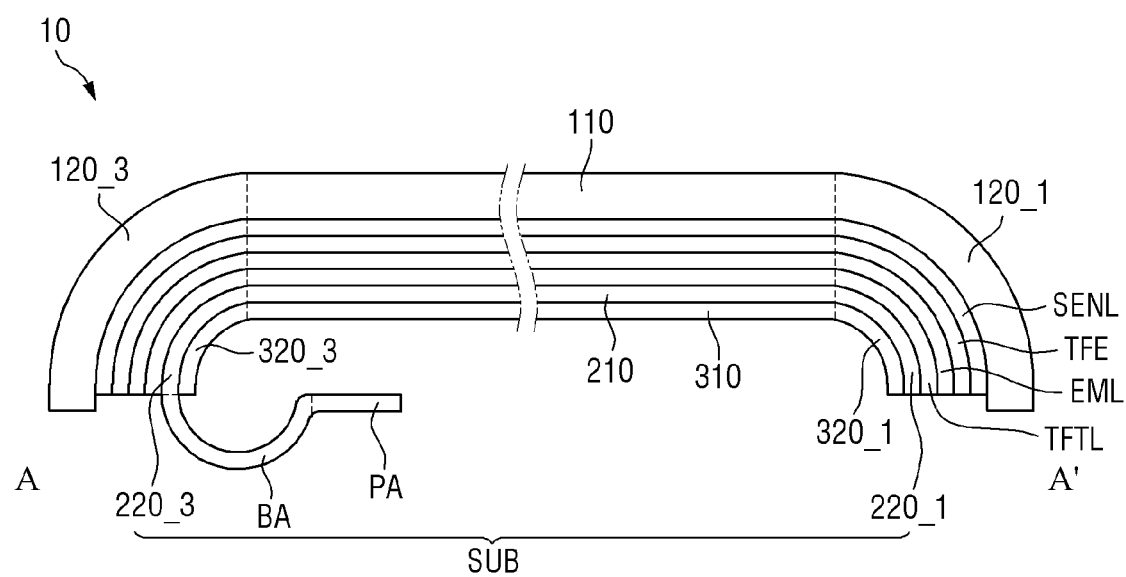
FIG. 3 is a cross-sectional view taken along line A-A' of FIG. 1.
Figure 3:
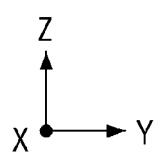
Figure 4:
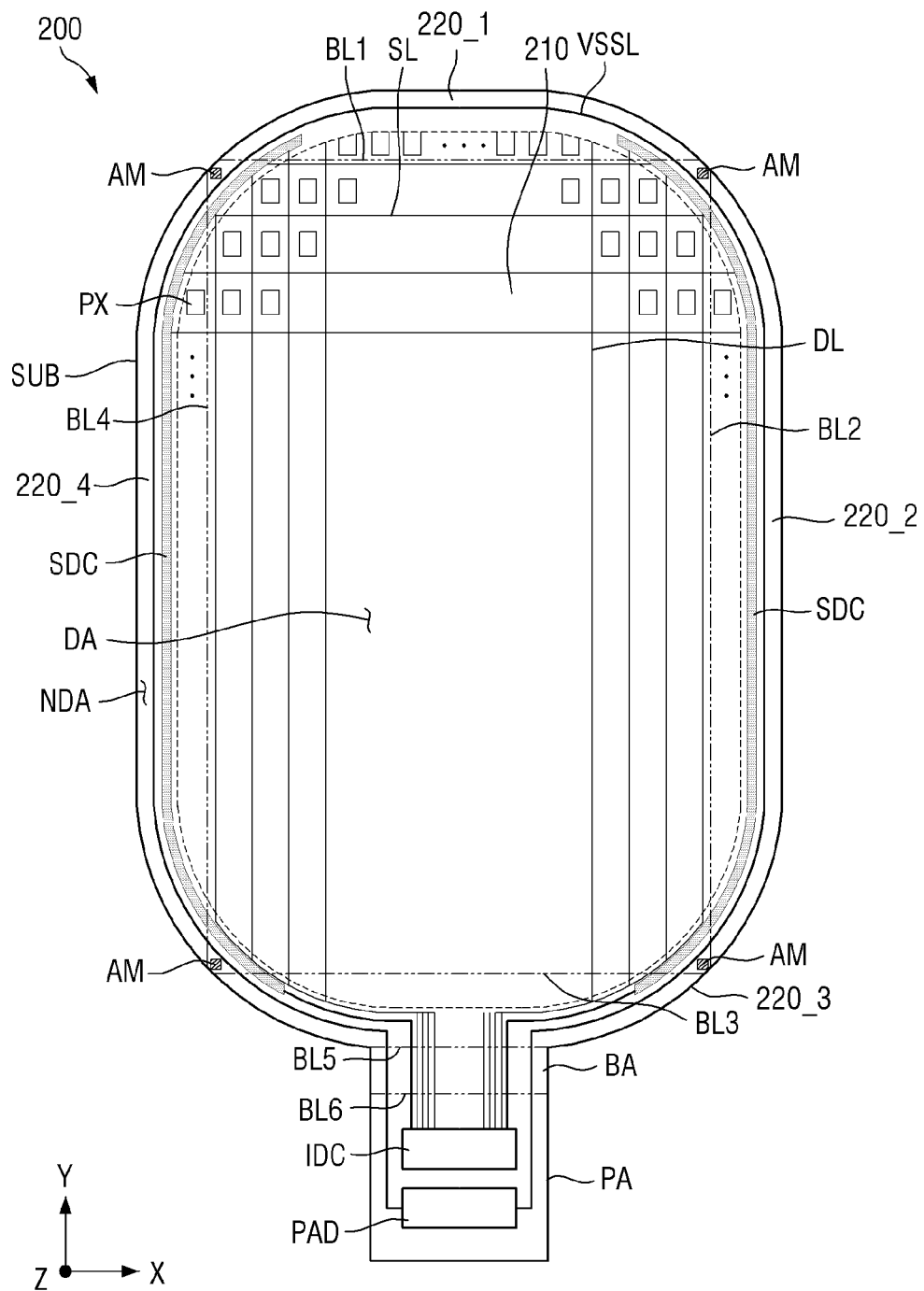
FIG. 4 is a plan view of a display panel of a display device according to an embodiment of the present disclosure when it is unfolded.
Figure 5:
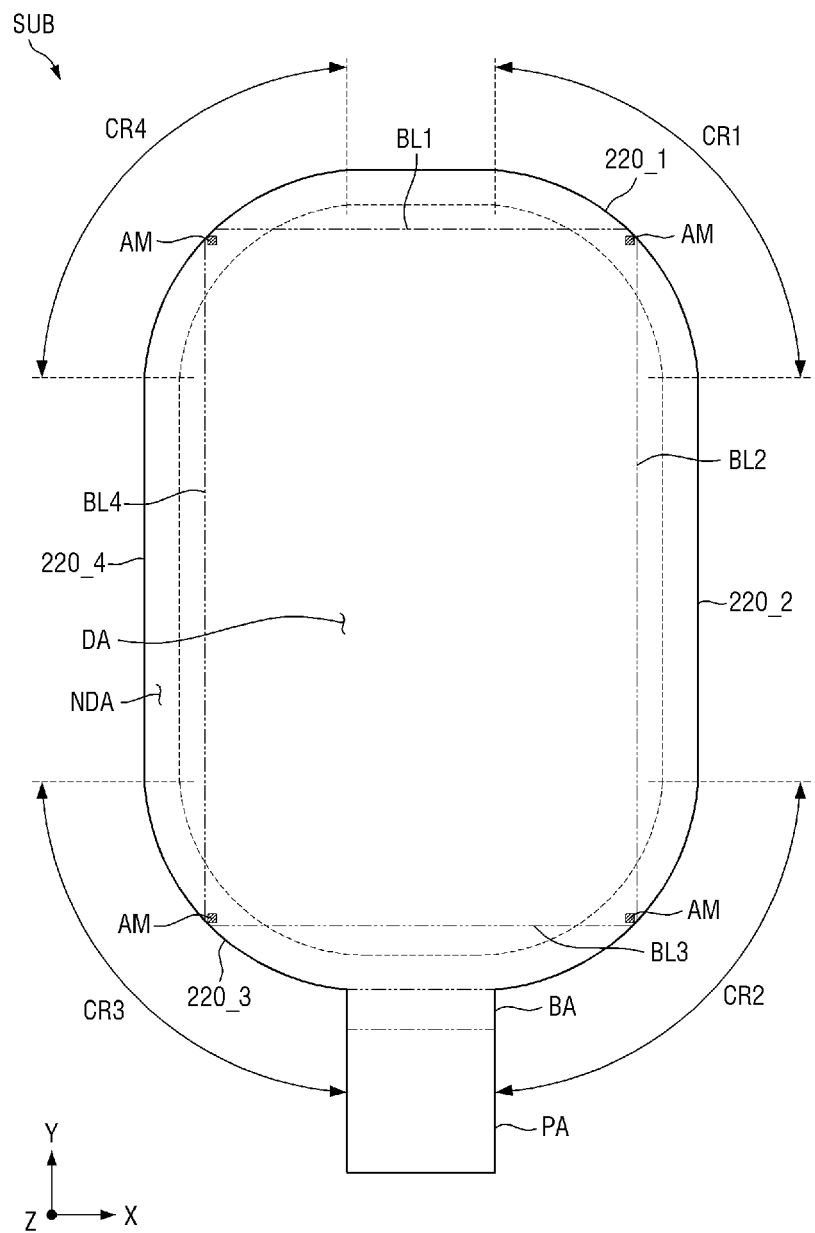
FIG. 5 is a plan view of a substrate of a display panel of a display device according to an embodiment of the present disclosure when it is unfolded.
Figure 6:
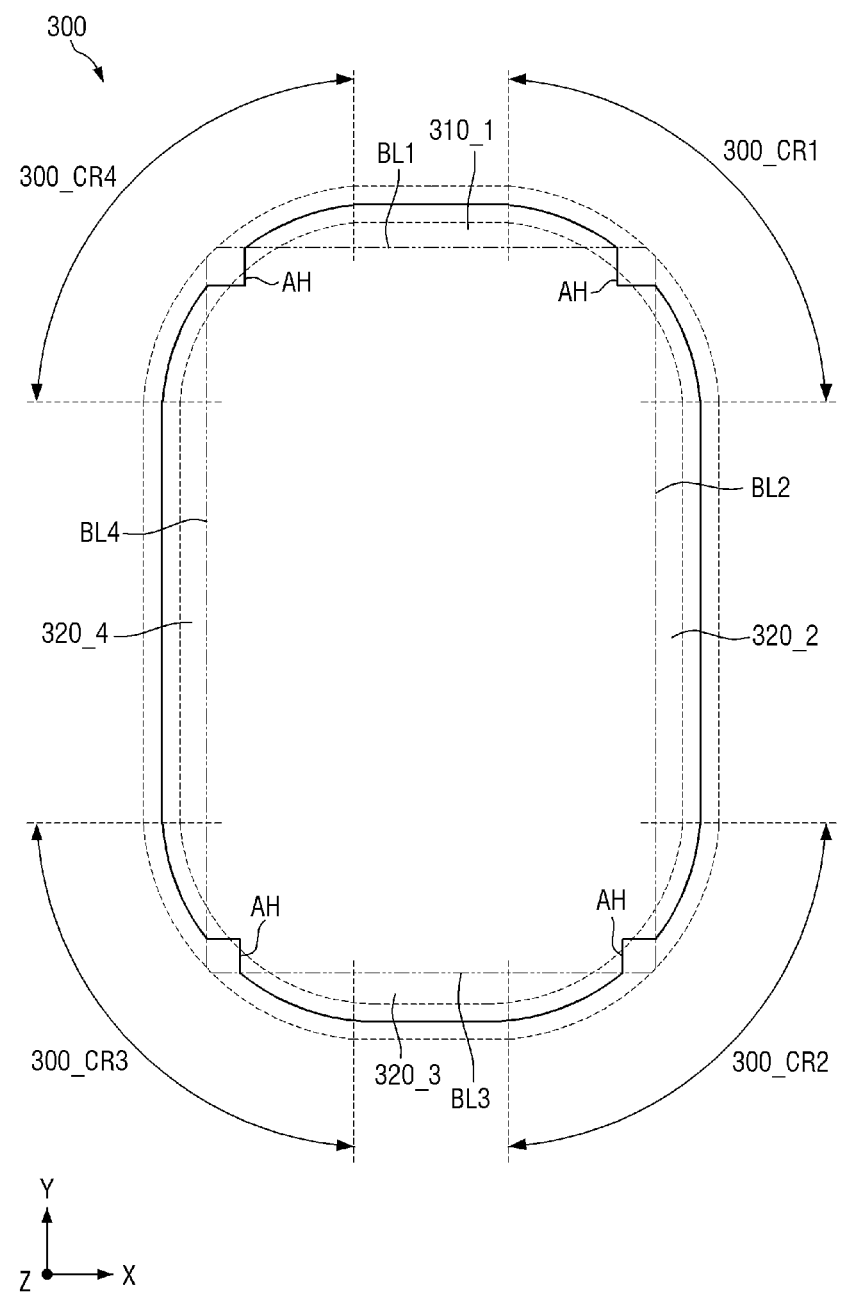
FIG. 6 is a plan view of a cover panel of a display device according to an embodiment of the present disclosure when it is unfolded.
Figure 7:
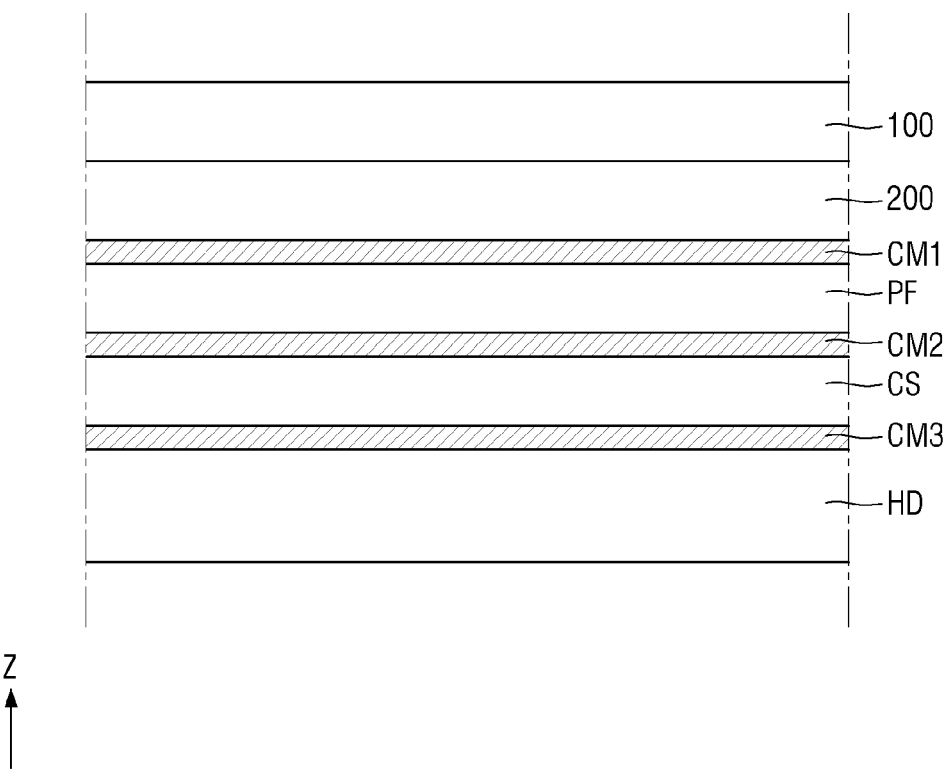
FIG. 7 is a cross-sectional view of a cover panel of a display device according to an embodiment of the present disclosure.

FIG. 1 is a perspective view showing a display device according to an embodiment of the present disclosure. FIG. 2 is an exploded, perspective view of a display device according to an embodiment of the present disclosure. FIG. 3 is a cross-sectional view taken along line A-A' of FIG. 1. FIG. 4 is a plan view of a display panel of a display device according to an embodiment of the present disclosure when it is unfolded. FIG. 5 is a plan view of a substrate of a display panel of a display device according to an embodiment of the present disclosure when it is unfolded. FIG. 6 is a plan view of a cover panel of a display device according to an embodiment of the present disclosure when it is unfolded. FIG. 7 is a cross-sectional view of a cover panel of a display device according to an embodiment of the present disclosure.

A display device 10 according to an embodiment of the present disclosure may be employed by a portable electronic device such as a mobile phone, a smart phone, a tablet PC, a mobile communications terminal, an electronic notebook, an electronic book, a portable multimedia player ("PMP"), a navigation device and an ultra mobile PC ("UMPC"). Alternatively, the display device 10 according to an embodiment of the present disclosure may be used as a display unit of a television, a laptop computer, a monitor, an electronic billboard, or the Internet of Things ("IOT"). Alternatively, the display device 10 according to the embodiment of the present disclosure may be applied to a wearable device such as a smart watch, a watch phone, a glasses-type display, and a head-mounted display ("HMD") device. Alternatively, the display device 10 according to the embodiment may be used as a center information display ("CID") disposed at the instrument cluster, the center fascia or the dashboard of a vehicle, as a room mirror display on the behalf of the side mirrors of a vehicle, as a display placed on the back of each of the front seats that is an entertainment system for passengers at the rear seats of a vehicle.

As used herein, a first direction X may refer to the horizontal direction in a plan view. A second direction Y may refer to the vertical direction in a plan view. A third direction Z may refer to the thickness direction (i.e., direction of the plan view). In FIG. 1, the upper side in the third direction Z may be referred to as the front side, while the lower side in the third direction Z may be referred to as the rear side. Accordingly, one surface of an element facing the front side may be referred to as a front surface, while the other surface of the element facing the rear side may be referred to as a rear surface. However, it is to be understood that the above described sides are and relative, and are not limiting.

Referring to FIGS. 1 to 3, the display device 10 according to an embodiment may include a cover window 100, a display panel 200, and a cover panel 300.

The cover window 100 is disposed to cover the display panel 200 (to be described later). The cover window 100 can protect the display panel 200.

The cover window 100 may include a front surface 110 and side surfaces 120.

The front surface 110 of the cover window 100 may have, but is not limited to, a substantially rectangular shape having shorter sides extended in the first direction X and longer sides extended in the second direction Y in a plan view. In another embodiment, the front surface 110 of the cover window 100 may have other polygonal shape, a circular shape or an oval shape when viewed from the top (i.e., in a plan view). The corners of the front surface 110 of the cover window 100 may have a curvature that is convex toward the outside when viewed from the top. In some embodiments, the corners of the front surface 110 may be bent in the thickness direction.

The side surfaces 120 of the cover window 100 are disposed at the edges of the front surface 110 of the cover window 100. The side surfaces 120 of the cover window 100 may be disposed to surround at least a part of the edges of the front surface 110 of the cover window 100. According to an embodiment of the present disclosure, the side surfaces 120 of the cover window 100 may be disposed to completely surround the edges of the front surface 110 of the cover window 100.

The side surfaces 120 of the cover window 100 are extended from the edges of the cover window 100 and are bent in the thickness direction (i.e., the third direction Z). According to an embodiment of the present disclosure, the angle between the front surface 110 and the side surfaces 120 of the cover window 100 may range, but is not limited to, from 70 degrees (°) to 120°.

The side surfaces 120 may include a first side surface 120_1, a second side surface 120_2, a third side surface 120_3 and a fourth side surface 120_4.

The first side surface 120_1, the second side surface 120_2, the third side surface 120_3 and the fourth side surface 120_4 of the cover window 100 are extended from the first side, the second side, the third side and the fourth side of the front surface 110 of the cover window 100, and bent in the thickness direction, respectively.

The first side surface 120_1, the second side surface 120_2, the third side surface 120_3 and the fourth side surface 120_4 of the cover window 100 may be disposed to completely surround the edges of the front surface 110 of the cover window 100. The outermost edges of the first side surface 120_1, the second side surface 120_2, the third side surface 120_3 and the fourth side surface 120_4 of the cover window 100 may form the border of the cover window 100.

The width of each of the first side surface 120_1, the second side surface 120_2, the third side surface 120_3 and the fourth side surface 120_4 of the cover panel 100 may become smaller toward the corners of the front surface 110 of the cover panel 100. The width may include a length in the third direction Z. Accordingly, gaps widening toward the lower side may be formed between the first side surface 120_1 and the second side surface 120_2, between the second side surface 120_2 and the third side surface 120_3, between the third side surface 120_3 and the fourth side surface 120_4, and between the fourth side portion 120_4 and the first side portion 120_1, respectively. The edge of each of the first side surface 120_1, the second side surface 120_2, the third side surface 120_3 and the fourth side surface 120_4 of the cover panel 100 may be in contact with the corners of the front surface 110 of the cover panel 100.

The cover window 100 may include or be made of, for example, a transparent insulating material such as glass and plastic. The cover window 100 may have flexibility.

The cover window 100 may include a transparent adhesive member such as an optically clear adhesive ("OCA") film.

Although not shown in the drawings, in some embodiments, the cover window 100 may further include a light-blocking area disposed in a band shape along the edges of the cover window 100. The light-blocking area may be disposed to overlap the non-display area of the display panel 200 to cover the non-display area. The non-display area of the display panel 200 refers to an area which includes no pixel PX and thus does not display an image. The light-blocking area may be opaque. In some embodiments, the display device may further include a light-blocking member disposed at a predetermined width along the edge of the rear surface of the cover window 100.

Referring to FIGS. 1 to 5, the display panel 200 may be a light-emitting display panel 200 including light-emitting elements. For example, the display panel 200 may be an organic light-emitting display panel using organic light-emitting diodes including an organic light-emitting layer 172 (See FIG. 10), a micro light-emitting diode display panel using micro LEDs, a quantum-dot light-emitting display panel including quantum-dot light-emitting diodes including an quantum-dot emissive layer, or an inorganic light-emitting display panel using inorganic light-emitting elements including an inorganic semiconductor. According to an embodiment of the present disclosure, the display panel 200 may be, but is not limited to, an organic light-emitting display panel.

Figure 10:
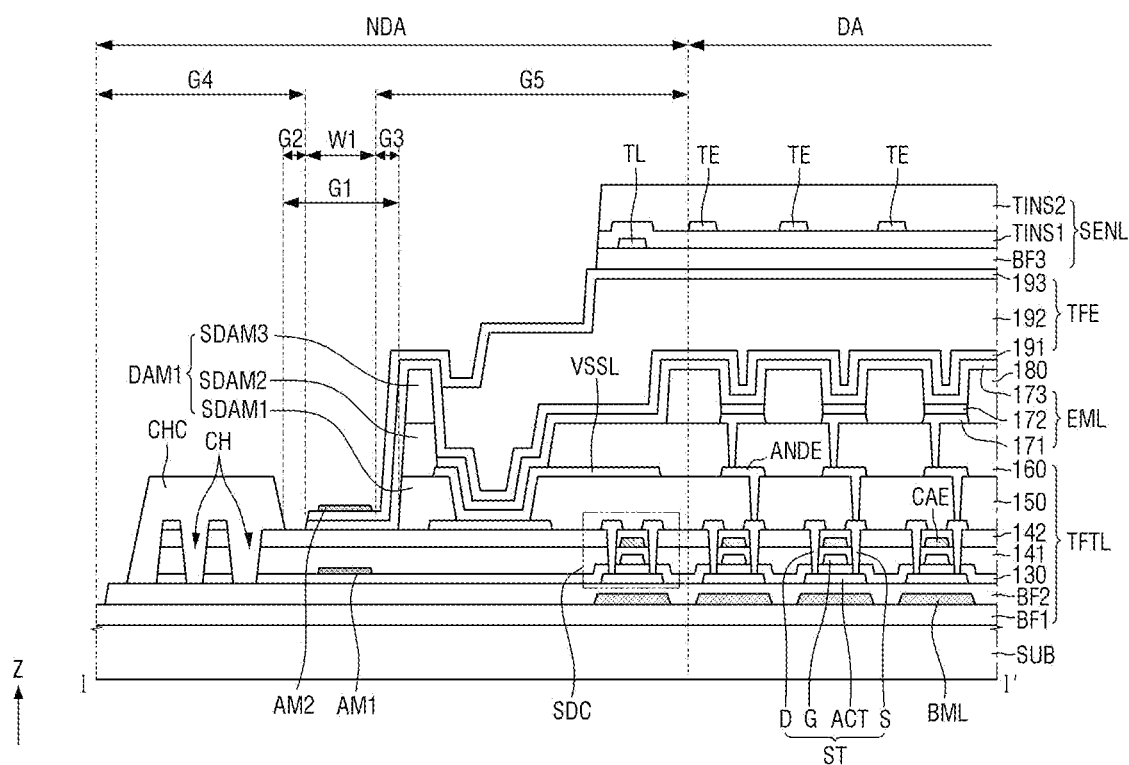
FIG. 10 is a cross-sectional view taken along line I-I' of FIG. 8.

The display panel 200 may include a substrate SUB (See FIG. 10).

The substrate SUB may have flexibility. Accordingly, the display panel 200 may be bent so that it conforms to the shape of the cover window 100 and may be attached to the cover window 100. Specifically, the display panel 200 may be attached on the inner surfaces of the space formed by the front surface 110 and the side surfaces 120 of the cover window 100. Specifically, a front surface 210, a first side surface 220_1, a second side surface 220_2, a third side surface 220_3 and a fourth side surface 220_4 of the display panel 200, which will be described later, may be attached to the front surface 110, the first side surface 120_1, the second side surface 120_2, the third side surface 120_3 and the fourth side surface 120_4 of the cover window 100, respectively.

The substrate SUB may be a flexible substrate that can be bent, folded, or rolled and may include or be made of plastic. For example, the substrate SUB may include or be made of polyethersulphone ("PES"), polyacrylate ("PA"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP") or a combination thereof. Alternatively, the substrate SUB may include a metallic material.

The substrate SUB may have the same size as the cover window 100 or may have a different size. According to an embodiment of the present disclosure, the substrate SUB may be smaller than the cover window 100. In some embodiments, the size of the substrate SUB may be equal to or larger than the size of the cover window 100.

Referring to FIGS. 4 and 5, the substrate SUB when viewed from the top (i.e., in a plan view) may have a substantially rectangular shape including shorter sides extended in the first direction X and longer sides extended in the second direction Y when it is unfolded. According to an embodiment of the present disclosure, one side of the substrate SUB may be extended to protrude outward to form a bridge area BA and a pad area PA, which will be described later. It is, however, to be understood that the present disclosure is not limited thereto. In some embodiments, the bridge area BA and the pad area PA may be replaced with a flexible film and a circuit board, respectively. The substrate SUB may have other polygonal shape, a circular shape or an oval shape when viewed from the top, in another embodiment.

When the substrate SUB is unfolded, the corners of the substrate SUB may have a convex curvature toward the outside when viewed from the top. The corners of the substrate SUB may include the corners of the front surface 210 (described later). According to an embodiment of the present disclosure, the edges of the side surfaces 220 of the substrate SUB, which will be described later, may be connected to one another to form the corners of the substrate SUB. Each of the corners of the substrate SUB may have at least one center of curvature. In some embodiments, the edges of the side surfaces 220 of the substrate SUB and the edges of the corners of the front surface 210 of the substrate SUB disposed therebetween may be connected to one another to form the corners of the substrate SUB. In some embodiments, the corners of the substrate SUB may be bent in the thickness direction.

For convenience of illustration, in FIG. 5, the upper right corner of the substrate SUB is referred to as a first corner CR1, the lower right corner thereof is referred to as a second corner CR2, the lower left corner thereof is referred to as a third corner CR3, and the upper left corner thereof is referred to as a fourth corner CR4.

The substrate SUB may further include the front surface 210 and the side surfaces 220. The substrate SUB may further include the bridge area BA and the pad area PA.

The front surface 210 of the substrate SUB may have, but is not limited to, a substantially rectangular shape including shorter sides extended in the first direction X and longer sides extended in the second direction Y when viewed from the top. In another embodiment, the front surface 210 of the substrate SUB may have other polygonal shape, a circular shape or an oval shape when viewed from the top. The corners of the front surface 210 of the substrate SUB may have a curvature that is convex toward the outside when viewed from the top. In some embodiments, the corners of the front surface 210 of the substrate SUB may be bent in the thickness direction.

The side surfaces 220 of the substrate SUB are disposed to surround at least a part of the front surface 210 of the substrate SUB. According to an embodiment of the present disclosure, the side surfaces 220 of the substrate SUB are disposed to completely surround the edge of the front surface 210 of the substrate SUB.

The side surfaces 220 of the substrate SUB may be extended from the edge of the substrate SUB and bent in the thickness direction. According to an embodiment of the present disclosure, the angle between the front surface 210 and the side surfaces 220 of the substrate SUB may range, but is not limited to, from 70° to 120°.

The side surfaces 220 of the substrate SUB may include the first side surface 220_1, the second side surface 220_2, the third side surface 220_3 and the fourth side surface 220_4.

The first side surface 220_1, the second side surface 220_2, the third side surface 220_3 and the fourth side surface 220_4 of the substrate SUB are extended from the first side, the second side, the third side and the fourth side of the front surface 210 of the substrate SUB, and bent in the thickness direction, respectively.

The first side surface 220_1, the second side surface 220_2, the third side surface 220_3 and the fourth side surface 220_4 of the substrate SUB may be disposed to completely surround the edges of the front surface 210 of the substrate SUB. The outermost edges of the first side surface 220_1, the second side surface 220_2, the third side surface 220_3 and the fourth side surface 220_4 of the substrate SUB may form the border of the substrate SUB.

The width of the first side surface 220_1, the second side surface 220_2, the third side surface 220_3 and the fourth side surface 220_4 of the substrate SUB may become smaller toward the corners of the front surface 210 of the substrate SUB. The width may include a length in the third direction Z. Accordingly, gaps widening toward the lower side may be formed between the first side surface 220_1 and the second side surface 220_2, between the second side surface 220_2 and the third side surface 220_3, between the third side surface 220_3 and the fourth side surface 220_4, and between the fourth side portion 220_4 and the first side portion 220_1, respectively. The edges of the first side surface 220_1, the second side surface 220_2, the third side surface 220_3 and the fourth side surface 220_4 of the substrate SUB may be in contact with the corners of the front surface 210 of the substrate SUB.

The first side surface 220_1, the second side surface 220_2, the third side surface 220_3 and the fourth side surface 220_4 of the substrate SUB may be bent to have a curvature that is convex toward the outside. The curvatures of the first side surface 220_1, the second side surface 220_2, the third side surface 220_3 and the fourth side surface 220_4 of the substrate SUB may be equal to one another or different from one another. For example, the first side surface 220_1 and the third side surface 220_3 of the substrate SUB may be bent with a first curvature, while the second side surface 220_2 and the fourth side surface 220_4 of the substrate SUB may be bent with a second curvature.

The first side surface 220_1, the second side surface 220_2, the third side surface 220_3 and the fourth side surface 220_4 of the substrate SUB may be bent along a first bending line BL1, a second bending line BL2, a third bending line BL3 and a fourth bending line BL4, respectively. The first bending line BL1, the second bending line BL2, the third bending line BL3 and the fourth bending line BL4 may be virtual lines serving as references for bending. The first bending line BL1 and the third bending line BL3 may be extended in the first direction X, and the second bending line BL2 and the fourth bending line BL4 may be extended in the second direction Y. According to an embodiment of the present disclosure, the first direction X may be perpendicular to the second direction Y.

The first bending line BL1 and the second bending line BL2, the second bending line BL2 and the third bending line BL3, the third bending line BL3 and the fourth bending line BL4 and/or the fourth bending line BL4 and the first bending line BL1 may meet or intersect each other around the edges of the substrate SUB, respectively. For example, the first bending line BL1 and the second bending line BL2, the second bending line BL2 and the third bending line BL3, the third bending line BL3 and the fourth bending line BL4 and/or the fourth bending line BL4 and the first bending line BL1 may meet or intersect each other at the edges of the substrate SUB or may intersect on the inner side or the outer side of the substrate SUB with respect to the edges.

The first bending line BL1, the second bending line BL2, the third bending line BL3 and the fourth bending line BL4 may meet to form corners. The corners of the bending lines may have a curvature that is convex toward the outside when viewed from the top. In some embodiments, the corners of the bending lines may be bent in the thickness direction. According to an embodiment of the present disclosure, the corners of the bending lines may be in contact with the edges of the substrate SUB. In some embodiments, a part of the corners of the bending lines may be disposed on the outer side of the substrate SUB with respect to the edges of the substrate SUB. In some embodiments, the corners of the bending lines may be spaced apart from the edges of the substrate SUB toward the inner side.

The bridge area BA may be extended from the lower side of the third side surface 220_3. The bridge area BA may be disposed between the third side surface 220_3 and the pad area PA. The length of the bridge area BA in the first direction X may be smaller than the length of the third side surface 220_3 in the first direction X. The bridge area BA may be bent along a fifth bending line BL5 on the lower side of the third side surface 220_3.

The pad area PA may be extended from the lower side of the bridge area BA. The length of the pad area PA in the first direction X may be larger than the length of the bridge area BA in the first direction X. It is, however, to be understood that the present disclosure is not limited thereto. The length of the pad area PA in the first direction X may be substantially equal to the length of the bridge area BA in the first direction X in an embodiment. The pad area PA may be bent along a sixth bending line BL6 on the lower side of the bridge area BA. The pad area PA may be disposed on the lower side of the front surface 210. According to an embodiment of the present disclosure, pads PAD and an integrated driver circuit IDC that receives digital video data and timing signals through the pads PAD may be disposed on the pad area PA.

The substrate SUB may further include a display area DA and a non-display area NDA. The display area DA is an area for displaying images. A plurality of pixels PX may be disposed in the display area DA. According to an embodiment of the present disclosure, the display area DA may be disposed across the front surface 210, the first side surface 220_1, the second side surface 220_2, the third side surface 220_3 and the fourth side surface 220_4 of the substrate SUB. The display area DA may be spaced apart from the edges of the substrate SUB. According to an embodiment of the present disclosure, the pixels PX, and scan lines SL and data lines DL connected to the pixels PX, etc. may be disposed in the display area DA.

In the non-display area NDA, no image is displayed. The non-display area NDA may include no pixel PX. The non-display area NDA may be arranged in a band shape surrounding the display area DA. The non-display area NDA may be disposed from the edges of the substrate SUB to the display area DA. The non-display area NDA may have a smaller area than the display area DA. In the non-display area NDA, a scan driver circuit SDC for applying scan signals to the scan lines SL, fan-out lines connecting the data lines DL with the integrated driver circuit IDC, a first supply voltage line VSSL, and other outer lines may be disposed.

The non-display area NDA may be disposed at the edge of the first side surface 220_1, the edge of the second side surface 220_2, the edge of the third side surface 220_3, the edge of the fourth side surface 220_4 and/or at the corners of the front surface 210. In FIG. 5 according to an embodiment of the present disclosure, the non-display area NDA may be disposed at the left edge, the upper edge and the right edge of the first side surface 220_1, at the upper edge, the right edge and the lower edge of the second side surface 220_2, at the right edge, the lower edge and the left edge of the third side surface 220_3, and at the lower edge, the left edge and the upper edge of the fourth side surface 220_4. Herein, the non-display area NDA may be disposed at the first corner CR1 of the front surface 210 that connects the right edge of the first side surface 220_1 with the upper edge of the second side surface 220_2, at the second edge CR2 of the front surface 210 that connects the lower edge of the second side surface 220_2 with the right edge of the third side surface 220_3, at the third corner CR3 that connects the left edge of the third side surface 220_3 with the lower edge of the fourth side surface 220_4, and at the fourth corner CR4 that connects the upper edge of the fourth side surface 220_4 with the left edge of the first side surface 220_1.

The display area and the non-display area substantially identical or similar to the display area DA and the non-display area NDA of the substrate SUB, respectively, may be defined in the display device 10 and other elements of the display device 10 depending on the arrangements and shapes of the display area DA and the non-display area NDA of the substrate SUB.

Referring to FIG. 3, the display layer 200 may further include a thin-film transistor layer TFTL, an emission material layer EML, and an encapsulation layer TFE disposed on the substrate SUB. The display panel 200 may further include a sensor electrode layer SENL.

The thin-film transistor layer TFTL, the emission material layer EML, the encapsulation layer TFE and the sensor electrode layer SENL may be disposed between the cover window 100 and the substrate SUB. The thin-film transistor layer TFTL, the emission material layer EML, the encapsulation layer TFE and the sensor electrode layer SENL may be bent together with the substrate SUB. Although not shown in the drawings, in some embodiments, an adhesive layer may be disposed between the cover window 100 and the display panel 200. The thin-film transistor layer TFTL, the emission material layer EML, the encapsulation layer TFE and the sensor electrode layer SENL will be described in detail later with reference to FIG. 10.

Referring to FIGS. 1 to 3, 6 and 7, the cover panel 300 is disposed on the rear surface of the display panel 200. The cover panel 300 may be attached to the rear surface of the display panel 200. The cover panel 300 may be flexible and thus may be bent or curved. The cover panel 300 may have a shape conforming to the shape of the display panel 200. According to an embodiment of the present disclosure, the cover panel 300 may have a substantially rectangular plate shape with four sides bent. Specifically, a front surface 310, a first side surface 320_1, a second side surface 320_2, a third side surface 320_3 and a fourth side part 320_4 of the cover panel 300, which will be described later, may be attached to the front surface 210, the first side surface 220_1, the second side surface 220_2, the third side surface 220_3 and the fourth side surface 220_4 of the display panel 200, respectively. The cover panel 300 may be flexible and thus may be bent or curved. The cover panel 300 may be implemented as an element in the form of a film.

The cover panel 300 may have either the same size as or a different size from the size of the display panel 200. According to an embodiment of the present disclosure, the size of the cover panel 300 may be smaller than that of the display panel 200. Accordingly, the edges of the cover panel 300 may be disposed to be spaced apart from the edges of the display panel 200 by a predetermined distance toward the inner side. In some embodiments, the size of the cover panel 300 may be equal to or larger than the size of the display panel 200. In some embodiments, the edges of the cover panel 300 and the edges of the display panel 200 may be arranged to overlap each other in the thickness direction.

The cover panel 300 may have, but is not limited to, a substantially rectangular shape having shorter sides extended in the first direction X and longer sides extended in the second direction Y when viewed from the top when it is unfolded. In another embodiment, for example, the cover panel 300 may have other polygonal shape, a circular shape or an oval shape when viewed from the top.

When the cover panel 300 is unfolded, the corners of the cover panel 300 may have a curvature that is convex toward the outside when viewed from the top. The corners of the cover panel 300 may include the corners of the front surface, which will be described later. According to an embodiment of the present disclosure, the edges of the side surfaces of the cover panel 300, which will be described later, may be connected to one another to form the corners of the cover panel 300. Each of the corners of the cover panel 300 may have at least one center of curvature. In some embodiments, the edges of the side surfaces of the cover panel 300 and the edges of the corners of the front surface of the cover panel 300 disposed therebetween may be connected to one another to form the corners of the cover panel 300. In some embodiments, the corners of the cover panel 300 may be bent in the thickness direction.

For convenience of illustration, as shown in FIG. 6, the upper right corner of the cover panel 300 is referred to as a first corner 300_CR1, the lower right corner thereof is referred to as a second corner 300_CR2, the lower left corner thereof is referred to as a third corner 300_CR3, and the upper left corner thereof is referred to as a fourth corner 300_CR4.

The cover panel 300 may further include the front surface 310 and the side surfaces 320.

The front surface 310 of the cover panel 300 may have, but is not limited to, a substantially rectangular shape including shorter sides extended in the first direction X and longer sides in the second direction Y when viewed from the top. The front surface 310 of the cover panel 300 may have other polygonal shape, a circular shape or an oval shape when viewed from the top in another embodiment. The corners of the front surface 310 of the cover window 300 may have a curvature that is convex toward the outside when viewed from the top (i.e., plan view). In some embodiments, the corners of the front surface 310 of the cover panel 300 may be bent in the thickness direction.

The side surfaces 320 of the cover panel 300 are disposed to surround at least a part of the front surface 310 of the cover panel 300. According to an embodiment of the present disclosure, the side surfaces 320 of the cover window 300 may be disposed to completely surround the edges of the front surface 310 of the cover window 300.

The side surfaces 320 of the cover panel 300 are extended from the edges of the cover panel 300 and are bent in the thickness direction. According to an embodiment of the present disclosure, the angle between the front surface 310 and the side surfaces 320 of the cover window 300 may range, but is not limited to, from 70° to 120°.

The side surfaces 320 of the cover panel 300 may include the first side surface 320_1, the second side surface 320_2, the third side surface 320_3 and the fourth side surface 320_4.

The first side surface 320_1, the second side surface 320_2, the third side surface 320_3 and the fourth side surface 320_4 of the cover panel 300 are extended from the first side, the second side, the third side and the fourth side of the front surface 310 of the cover panel 300, and bent in the thickness direction.

The first side surface 320_1, the second side surface 320_2, the third side surface 320_3 and the fourth side surface 320_4 of the cover panel 300 may be disposed to completely surround the edges of the front surface 310 of the cover panel 300. The outermost edges of the first side surface 320_1, the second side surface 320_2, the third side surface 320_3 and the fourth side surface 320_4 of the cover panel 300 may form the border of the cover panel 300.

The width of the first side surface 320_1, the second side surface 320_2, the third side surface 320_3, and the fourth side surface 320_4 of the cover panel 300 may become smaller toward the corners of the front surface 310 of the cover panel 300. The width may include a length in the third direction Z. Accordingly, gaps widening toward the lower side may be formed between the first side surface 320_1 and the second side surface 320_2, between the second side surface 320_2 and the third side surface 320_3, between the third side surface 320_3 and the fourth side surface 320_4, and between the fourth side surface 320_4 and the first side surface 320_1. The first side surface 320_1, the second side surface 320_2, the third side surface 320_3, and the fourth side surface 320_4 of the cover panel 300 may be in contact with the corners of the front surface 310 of the cover panel 300.

The first side surface 320_1, the second side surface 320_2, the third side surface 320_3 and the fourth side surface 320_4 of the cover panel 300 may be bent to have a curvature that is convex toward the outside. The curvatures of the first side surface 320_1, the second side surface 320_2, the third side surface 320_3 and the fourth side surface 320_4 of the cover panel 300 may be equal to one another or different from one another. For example, the first side surface 320_1 and the third side surface 320_3 of the cover panel 300 may be bent with a first curvature, while the second side surface 320_2 and the fourth side surface 320_4 of the cover panel 300 may be bent with a second curvature.

The first side surface 320_1, the second side surface 320_2, the third side surface 320_3 and the fourth side surface 320_4 of the cover panel 300 may be bent along a first bending line BL1, a second bending line BL2, a third bending line BL3 and a fourth bending line BL4, respectively. The first bending line BL1, the second bending line BL2, the third bending line BL3 and the fourth bending line BL4 may be virtual lines serving as references for bending. The first bending line BL1 and the third bending line BL3 may be extended in the first direction X, and the second bending line BL2 and the fourth bending line BL4 may be extended in the second direction Y. According to an embodiment of the present disclosure, the first direction X may be perpendicular to the second direction Y.

The first bending line BL1 and the second bending line BL2, the second bending line BL2 and the third bending line BL3, the third bending line BL3 and the fourth bending line BL4 and/or the fourth bending line BL4 and the first bending line BL1 may meet or intersect each other around the edges of the cover panel 300. For example, the first bending line BL1 and the second bending line BL2, the second bending line BL2 and the third bending line BL3, the third bending line BL3 and the fourth bending line BL4 and/or the fourth bending line BL4 and the first bending line BL1 may meet or intersect each other at the edges of the cover panel 300 or may intersect on the inner side or the outer side of the cover panel 300 with respect to the edges.

The first bending line BL1, the second bending line BL2, the third bending line BL3 and the fourth bending line BL4 may meet to form corners. The corners of the bending lines may have a curvature that is convex toward the outside when viewed from the top. In some embodiments, the corners of the bending lines may be bent in the thickness direction. According to an embodiment of the present disclosure, the corners of the bending lines may be in contact with the edges of the cover panel 300. In some embodiments, a part of the corners of the bending lines may be disposed on the outer side of the cover panel 300 with respect to the edges of the cover panel 300. In some embodiments, the corners of the bending lines may be spaced apart from the edges of the cover panel 300 toward the inner side.

According to an embodiment of the present disclosure, the first bending line BL1 to the fourth bending line BL4 of the cover panel 300 may be substantially identical to the first bending line BL1 to the fourth bending line BL4 of the display panel 200 shown in FIGS. 4 and 5. In some embodiments, at least one of the spacing between the first bending line BL1 and the third bending line BL3 and the spacing between the second bending line BL2 and the fourth bending line BL4 of the cover panel 300 may be smaller than the spacing between the first bending line BL1 and the third bending line BL3 and the spacing between the second bending line BL2 and the fourth bending line BL4 of the display panel 300, respectively.

Referring to FIG. 7, the cover panel 300 may include a polymer film layer PF, a cushion member CS, and a heat dissipation member HD which are sequentially stacked on the rear surface of the display panel 200.

The polymer film layer PF may include a polymer film. The polymer film layer PF may include, for example, polyimide (PI), polyethylene terephthalate (PET), polycarbonate (PC), polyethylene ("PE"), polypropylene ("PP"), polysulfone ("PSF"), polymethyl methacrylate ("PMMA"), triacetyl cellulose ("TAC"), cycloolefin polymer ("COP"), etc. The polymer film layer PF may include a functional layer on at least one surface. The functional layer may include, e.g., a light-absorbing layer. The light-absorbing layer may include a light-absorbing material such as a black pigment and dye. The light-absorbing layer may be formed on a polymer film by coating or printing a black ink.

The cushion member CS may be disposed on the rear side of the polymer film layer PF. The cushion member CS may absorb an external shock to prevent the display device 10 from being damaged. The cushion member CS may be made up of a single layer or a stack of multiple layers. The cushion member CS may include a material having elasticity such as polyurethane and a polyethylene resin. The cushion member CS may be a cushion layer. In some implementations, the cushion member CS may be eliminated.

The heat dissipation member HD may be disposed on the rear side of the cushion member CS. The heat dissipation member HD serves to diffuse heat generated from the display panel 200 or other elements of the display device 10. The heat dissipation member HD may include a metal plate. The metal plate may include, for example, a metal having excellent thermal conductivity such as copper and silver. The heat dissipation member HD may be a heat dissipation sheet including graphite or carbon nanotubes. The heat dissipation member HD may shield electromagnetic waves in addition to the heat dissipation function.

The cover panel 300 may further include coupling members CM1, CM2 and CM3 that couple adjacent ones of the elements with each other on the rear side. For example, the first coupling member CM1 may be disposed between the display panel 200 and the polymer film layer PF, the second coupling member CM2 may be disposed between the polymer film layer PF and the cushion member CS, and the third coupling member CM3 may be disposed between the polymer film layer PF and the heat dissipation member HD.

Referring back to FIGS. 4 and 5, the display panel 200 may further include alignment marks.

The alignment marks AM may be used as identification marks for aligning and assembling the display panel 200 with another element. For example, the another element may be the cover panel 300. For another example, the another member may be the cover window 100.

The alignment marks AM may be disposed on at least one of the first corner CR1, the second corner CR2, the third corner CR3 and the fourth corner CR4 of the display panel 200. According to an embodiment of the present disclosure, the alignment marks AM may be disposed at the first corner CR1, the second corner CR2, the third corner CR3, and the fourth corner CR4, respectively. According to an embodiment of the present disclosure, the alignment marks AM may be disposed at the non-display areas NDA of the first corner CR1, the second corner CR2, the third corner CR3, and the fourth corner CR4.

The alignment marks AM may include an opaque material. The alignment marks AM, the thin-film transistor layer TFTL, the emission material layer EML, the encapsulation layer TFE and the sensor electrode layer SENL may include the same material. The same material may be a metal. For example, the alignment marks AM may include one of molybdenum (Mo), aluminum (Al), chromium (Cr), gold (Au), titanium (Ti), nickel (Ni), neodymium (Nd) and copper (Cu) or an alloy thereof. The arrangement and shape of the alignment marks will be described later with reference to FIGS. 8 and 11.

Referring to FIG. 6, the cover panel 300 may define at least one alignment notch AH. Specifically, the cover panel 300 may also include identification marks for alignment having a notch shape, like the display panel 200. In some embodiments, the identification marks may be substantially identical or similar to the alignment marks AM of the display panel 200.

The alignment notch AH may be used as an identification mark for aligning and assembling the display panel 300 with another element. For example, the another element may be the display panel 200.

The alignment notch AH may be defined at at least one of the first corner 300_CR1, the second corner 300_CR2, the third corner 300_CR3 and the fourth corner 300_CR4 of cover panel 300. According to an embodiment of the present disclosure, the alignment notches AH may be defined at the first corner 300_CR1, the second corner 300_CR2, the third corner 300_CR3, and the fourth corner 300_CR4, respectively. According to an embodiment of the present disclosure, the alignment notches AH may be defined so that at least a part thereof overlaps the non-display area NDA of the display panel 200 in the thickness direction. In FIG. 6, the outermost broken lines illustrate the boundary of the display panel 200, and the solid line inside the outermost broken lines illustrates the boundary of the cover panel 300

The alignment notches AH may have a shape indented from the edges of the first corner 300_CR1, the second corner 300_CR2, the third corner 300_CR3 and/or the fourth corner 300_CR4 of the cover panel 300. In other words, the alignment notches AH may have a shape defined by cutting off a part of the cover panel 300. According to an embodiment of the present disclosure, the alignment notches AH may have a L-shape defined by cutting off the edges of the first corner 300_CR1, the second corner 300_CR2, the third corner 300_CR3 and the fourth corner 300_CR4 when viewed from the top.

As described above, the alignment notches AH of the cover panel 300 may be used as the identification marks for align and assembling the cover panel 300 with the display panel 200 together with the alignment marks AM of the display panel 200. Firstly, the alignment marks AM of the display panel 200 will be described in detail with reference to FIGS. 8 to 11.

Figure 8:
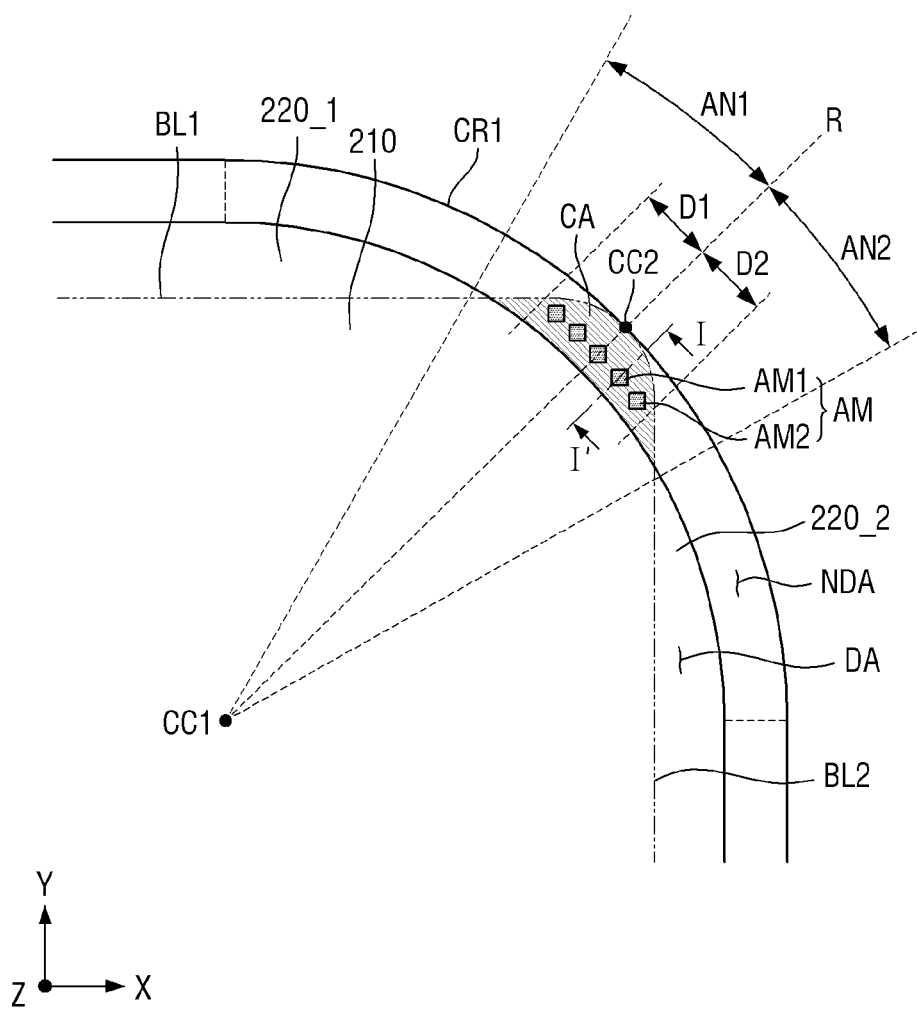
FIG. 8 is an enlarged plan view of a first corner of a display panel of a display device according to an embodiment of the present disclosure before a side surface is bent.
Figure 9:
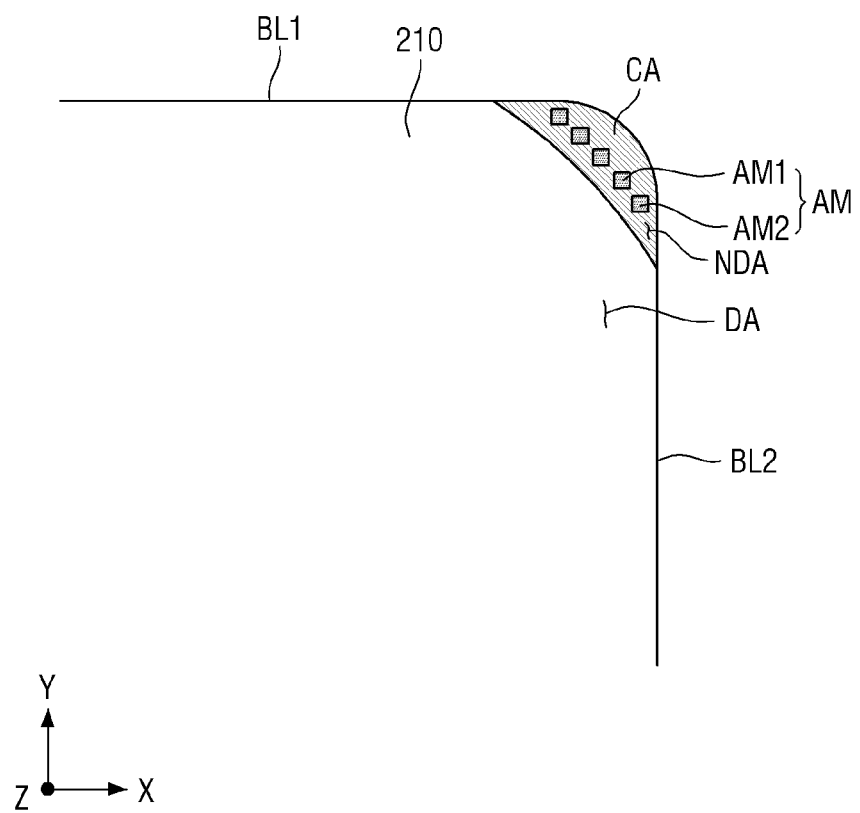
FIG. 9 is an enlarged plan view of a first corner of a display panel of a display device according to an embodiment of the present disclosure after a side surface is bent.
Figure 11:
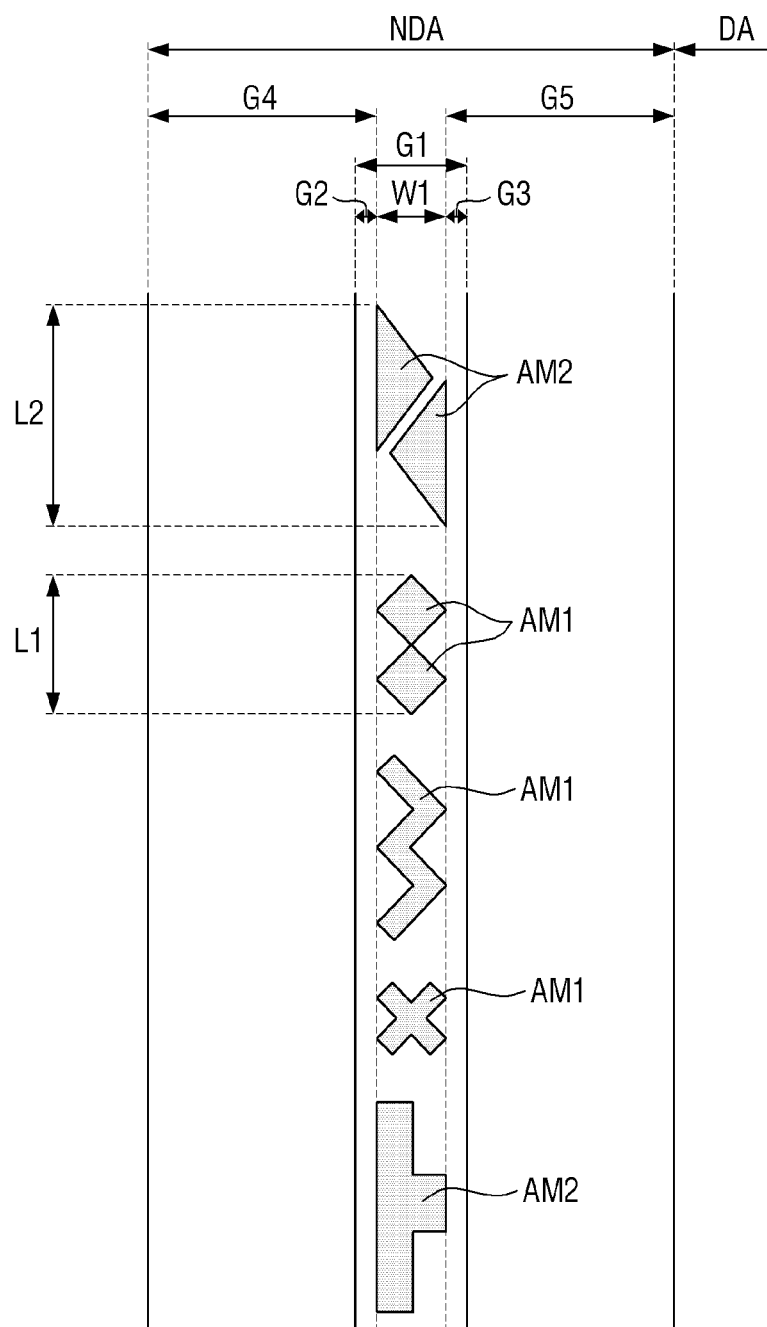
FIG. 11 is a plan view of the non-display area of FIG. 10.

FIG. 8 is an enlarged plan view of a first corner of a display panel of a display device according to an embodiment of the present disclosure before a side surface is bent. FIG. 9 is an enlarged plan view of a first corner of a display panel of a display device according to an embodiment of the present disclosure after a side surface is bent. FIG. 10 is a cross-sectional view taken along line I-I' of FIG. 8. FIG. 11 is a plan view of the non-display area of FIG. 10.

The alignment marks AM disposed at the second corner CR2, the third corner CR3 and the fourth corner CR4 of the display panel 200 are substantially identical or similar to the alignment mark AM disposed at the first corner CR1, and thus only the alignment mark AM disposed at the first corner CR1 will be described.

Referring to FIGS. 8 and 9, the alignment marks AM may be disposed in a center area CA of the first corner CR1.

In the center area CA of the first corner CR1, no distortion due to the bending of the side surfaces 220 of the display panel 200 may occur or relatively less distortion may occur than other areas. Accordingly, it is possible to identify the alignment marks AM even when the side surfaces 220 of the display panel 200 are bent, unlike the alignment marks AM disposed in a straight line area at the edge of the side surfaces 220 of the display panel 200, etc.

The center area CA of the first corner CR1 may be a part of the non-display area NDA disposed along the edges of the first corner CR1 which is disposed at the corner of the front surface 210 of the substrate SUB. The center area CA of the first corner CR1 may further include a part of the non-display area NDA of the first side surface 220_1 and the second side surface 220_2 which is adjacent to the part of the non-display area NDA disposed at the corner of the front surface 210 of the substrate SUB.

The center area CA of the first corner CR1 may be located on the inner side of the bending lines. Specifically, the center area CA of the first corner CR1 may be an area of the first corner CR1 that is located on the inner side of the first bending line BL1 and the second bending line BL2. The inner side may refer to the side closer to the center of the substrate SUB. According to an embodiment of the present disclosure, the center area CA of the first corner CR1 may be a part of the first corner CR1 that is not bent downward. In some embodiments, the center area CA of the first corner CR1 may be bent together with the first side surface 220_1 and the second side surface 220_2 when they are bent in the thickness direction. Accordingly, the alignment marks AM may also be bent in the thickness direction. The center area CA of the first corner CR1 may be less bent than the first side surface 220_1 and the second side surface 220_2. For example, a difference in height between the center area CA of the first corner CR1 and the center portion of the front surface 210 of the substrate SUB may range approximately from 0.2 millimeters (mm) to 0.8 mm.

The center area CA of the first corner CR1 may lie within a predetermined range from the center of the first corner CR1. The center area CA of the first corner CR1 may be spaced apart from the shorter sides of the substrate SUB extended in the first direction X and the longer sides thereof in the second direction Y. The size of the center area CA of the first corner CR1 may be approximately one-fourth the size of the first corner CR1. The center area CA of the first corner CR1 may lie within a predetermined range from a reference line R. The reference line R may be a virtual line passing through a center CC2 of the first corner CR1 and a center of curvature CC1 of the first corner CR1. The center CC2 of the first corner CR1 may be a point that equally divides an arc of the edge of the first corner CR1. The reference line R may form a predetermined angle with the first bending line BL1 and/or the second bending line BL2. For example, the predetermined angle may be approximately 30° to 60°. For another example, the predetermined angle may be approximately 45°.

The center area CA of the first corner CR1 may lie within a predetermined distance range from a reference line R. According to an embodiment of the present disclosure, the center area CA of the first corner CR1 may be located within a first distance D1 from the reference line R counterclockwise, and within a second distance D2 from the reference line R clockwise. The first distance D1 may be equal to or different from the second distance D2. For example, the first distance D1 and the second distance D2 may be larger than 0 mm and equal to or less than 1 mm. For another example, the first distance D1 may be larger than 0 mm and equal to or less than 0.5 mm, and the second distance D2 may be larger than 0 mm and equal to or less than 1.5 mm. The radius of curvature of the arc of the first corner CR1 may be approximately 8 mm to 12 mm, and the length of the arc of the first corner CR1 may be approximately 15 mm to 20 mm.

The center area CA of the first corner CR1 may lie within a predetermined angle range from the reference line R. According to an embodiment of the present disclosure, the center area CA of the first corner CR1 may be located within a first angle AN1 from the reference line R counterclockwise, and within a second angle AN2 from the reference line R clockwise, with respect to the curvature radius of the first corner CR1. The first angle AN1 may be equal to or different from the second angle AN2. For example, the first angle AN1 and the second angle AN2 may be greater than approximately 0° and less than 15°. For another example, the first angle AN1 may be greater than approximately 0° and equal to or less than 15°, and the second angle AN2 may be greater than 0° and equal to or less than 30°. For another example, the first angle AN1 and the second angle AN2 may be approximately 11.25°.

Referring to FIG. 9, the display device 10 can allow the alignment marks AM of the display panel 200 that is bent along bending lines in different directions to be recognized more easily. Specifically, cameras VC for determining whether the substrate SUB and the cover window 100 are aligned correctly during the process of attaching them is typically placed on the upper side (or front side) or the lower side (or rear side) of the substrate SUB. If the alignment marks AM are disposed between the corners of the substrate SUB, for example, in the straight portions of the non-display area NDA passing through the side surfaces, it is likely that the alignment marks AM are not easily recognized by a detector (e.g., the cameras VC) as the side surfaces 220 of the substrate SUB are bent or distortion due to the bending may occur. In contrast, as shown in FIG. 6, the alignment marks AM of the display device 10 according to an embodiment of the present disclosure are disposed at the center area CA of the first corner CR1, so that they can be easily recognized by the camera VC since distortion due to the bending is reduced even when the first side surface 220 to the fourth side surface 220_4 of the substrate SUB are all bent.

In addition, the alignment marks AM are disposed at the first corner CR1, the second corner CR2, the third corner CR3 and the fourth corner CR4, respectively, so that they are spaced apart from one another as much as possible. This allows for more precise alignment compared to the alignment marks disposed between the corners of the substrate when an error has occurred.

A plurality of alignment marks AM may be disposed at the first corner. According to an embodiment of the present disclosure, the plurality of alignment marks AM may include first marks AM1 and second marks AM2 disposed on two different layers among the plurality of layers stacked on the substrate SUB, respectively. In some embodiments, multiple alignment marks AM may be disposed on the same layer. A stack structure of the display panel 200 will be described with reference to FIG. 10.

Referring to FIG. 10, the display panel 200 may include the thin-film transistor layer TFTL on the substrate SUB, the emission material layer EML on the thin-film transistor layer TFTL, and the encapsulation layer TFE on the emission material layer EML. The display panel 200 may further include the sensor electrode layer SENL on the encapsulation layer TFE.

The thin-film transistor layer TFTL may include thin-film transistors ST. Each of the thin-film transistors ST may be implemented by an active layer ACT, a gate electrode G, a source electrode S, and a drain electrode D, which will be described later. The thin-film transistors ST may include a pixel transistor disposed in the display area DA and a scan driving transistor disposed in the non-display area NDA. According to an embodiment of the present disclosure, the scan driver circuit SDC of the display panel 200 may be implemented by the scan driving transistor.

The thin-film transistor layer TFTL may further include a buffer film BF, an active layer ACT on the buffer film BF, a gate insulator 130 on the active layer ACT, a gate electrode G on the gate insulator 130, a first interlayer dielectric layer 141 on the gate electrode G, a capacitor electrode CAE on the first interlayer dielectric layer 141, a second interlayer dielectric layer 142 on the capacitor electrode CAE, a source electrode S penetrating through the insulating layers films and connecting to one side of the active layer ACT, a drain electrode D penetrating through the insulating layers and connecting to the other side of the active layer ACT, a first organic film 150 on the source electrode S and the drain electrode D, a first power connection line VSEL on the second interlayer dielectric layer 142, a first supply voltage line VSSL disposed on the first organic film 150 and passing through the first organic film 150 to be connected to the first power connection line VSEL, a first connection electrode ANDE penetrating through the first organic film 150 to connect to the drain electrode D, and a second organic film 160 on the first connection electrode ANDE.

The buffer film BF may include a first buffer film BF1 disposed on the substrate SUB, a second buffer film BF2 disposed on the first buffer film BF1, and a light-blocking layer BML disposed between first buffer film BF1 and the second buffer films BF2.

The light-blocking layer BML, the gate electrode G, the source electrode S, the drain electrode D, a first supply voltage line VSEL, a first supply voltage line VSSL, and a connection electrode ANDE may include a metal material. For example, the metal material may include one of molybdenum (Mo), aluminum (Al), chromium (Cr), gold (Au), titanium (Ti), nickel (Ni), neodymium (Nd) and copper (Cu) or an alloy thereof.

The active layer ACT may include polycrystalline silicon, single crystal silicon, low-temperature polycrystalline silicon, amorphous silicon, or an oxide semiconductor. The oxide semiconductor material may include indium (In), gallium (Ga), zinc (Zn), aluminum (Al), tin (Sn), zirconium (Zr), hafnium (Hf), cadmium (Cd), nickel (Ni), copper (Cu), etc. When the active layer ACT includes a material such as polycrystalline silicon and oxide semiconductor, the ion-doped regions of the active layer ACT may be conductive regions having conductivity.

The emission material layer EML may be disposed on the second organic film 160. The emission material layer EML may include a first light-emitting electrode 171 on the second organic film 160, an organic light-emitting layer 172 on the first light-emitting electrode 171, a second light-emitting electrode 173 on the organic light-emitting layer 172, and a bank 180 on the second organic film 160.

The first light-emitting electrode 171 and the second light-emitting electrode 173 may include a metal material. For example, the metal material may include one of molybdenum (Mo), aluminum (Al), chromium (Cr), gold (Au), titanium (Ti), nickel (Ni), neodymium (Nd) and copper (Cu) or an alloy thereof.

The encapsulation layer TFE may be disposed on the emission material layer EDL. The encapsulation layer TFE may include a first inorganic film 191 on the second light-emitting electrode 173, a second inorganic film 193 on the first inorganic film 191, and an organic film 192 between the first inorganic film 191 and the second inorganic film 193.

The first inorganic film 191 and the second inorganic film 193 may include at least one of a silicon nitride layer, a silicon oxynitride layer, a silicon oxide layer, a titanium oxide layer, and an aluminum oxide layer.

A part of the first inorganic film 191 and the second inorganic film 193 may be disposed between an anti-crack hole CH and a dam DAM1, which will be described later. Specifically, a part of the first inorganic film 191 and the second inorganic film 193 may be disposed between an organic film cover CHC covering the anti-crack hole CH and the dam DAM1. A part of the first inorganic film 191 and the second inorganic film 193 may be disposed flat on the second interlayer dielectric layer 142. A part of the first inorganic film 191 and the second inorganic film 193 may be extended flat on the second interlayer dielectric layer 142 toward the organic film cover CHC from the dam DAM1, with a predetermined width. According to an embodiment of the present disclosure, the predetermined width may be approximately 100 micrometers (μm) to 150 μm.

The edges of the first inorganic film 191 and the second inorganic film 193 may be disposed between the anti-crack hole CH and a dam DAM1. Specifically, the second interlayer dielectric layer 142 may be exposed between the organic film cover CHC and the dam DAM1, and a part of the first inorganic film 191 and the second inorganic film 193 may cover at least a part of the second interlayer dielectric layer 142. At least a part of each of the edges of the first inorganic film 191 and the second inorganic film 193 may or may not overlap in the third direction Z. The edges of the first inorganic film 191 and the second inorganic film 193 may be disposed to be spaced apart from the organic film cover CHC by a predetermined width. According to an embodiment of the present disclosure, the predetermined width may be approximately 50 μm to 100 μm.

The sensor electrode layer SENL is disposed on the encapsulation layer TFE. The sensor electrode layer SENL may be a touch electrode layer that senses a touch of a person or object. The sensor electrode layer SENL may include a third buffer film BF3 on the encapsulation layer TFE, a sensing line TL on the third buffer film BF3, a first sensor insulating layer TINT1 on the sensing line TL, a sensing electrode TE on the first sensor insulating film TINS1, and a second sensor insulating film TINS2 on the sensing electrode TE.

The sensing line TL and the sensing electrode TE may include a metal material. For example, the metal material may include one of molybdenum (Mo), aluminum (Al), chromium (Cr), gold (Au), titanium (Ti), nickel (Ni), neodymium (Nd) and copper (Cu) or an alloy thereof.

The display panel 200 may further include the anti-crack hole CH, the organic film cover CHC, and the dam DAM1.

The anti-crack hole CH is disposed adjacent to the edges of the display panel 200. The anti-crack hole CH passes through the first interlayer dielectric layer 141, the second interlayer dielectric layer 142, and the gate insulator 130. The anti-crack hole CH can prevent the crack from propagating.

The organic film cover CHC covers the anti-crack hole CH. The organic film cover CHC may be formed together with the first organic film 150 or may be a part of the first organic film 150. The organic film cover CHC may be disposed to be spaced apart from the outermost edge of the display panel 200 by a predetermined distance toward the inner side. For example, the predetermined distance may be approximately 80 μm to 100 μm. The organic film cover CHC may be disposed to have a predetermined width. For example, the predetermined width may be approximately 20 μm to 40 μm.

The dam DAM1 is disposed in the non-display area NDA to surround the edge of the organic film 192 of the encapsulation layer TFE. The dam DAM1 prevents the organic film 192 of the encapsulation layer TFE from overflowing. The dam DAM1 may include a first sub-dam SDAM1 made of the same material as the first organic film 150, a second sub-dam SDAM2 made of the same material as the second organic film 160, and a third sub-dam SDAM3 made of the same material as the bank 180.

Due to the dam DAM1, an end of the organic film 192 of the encapsulation layer TFE may be disposed between the display area DA and the dam DAM1. The first inorganic film 191 and the second inorganic film 193 may be disposed on the dam DAM1. The first inorganic film 191 and the second inorganic film 193 may be in contact with each other on the dam DAM1.

The dam DAM1 may be disposed more to the inside of the display panel 200 than the anti-crack hole CH and/or the organic film cover CHC (See FIG. 10). The dam DAM1 may be spaced apart from the edge of the display panel 200 by a predetermined distance. For example, the predetermined distance may be approximately 285 μm to 335 μm.

Referring to FIG. 10, as described above, the alignment marks AM1 and AM2 are disposed in the non-display area NDA. According to an embodiment of the present disclosure, the alignment marks AM1 and AM2 may be disposed between the anti-crack hole CH and the dam DAM1. Specifically, the alignment marks AM1 and AM2 may be disposed between the organic film cover CHC covering the anti-crack hole CH and the dam DAM1.

The alignment marks AM1 and AM2 may be disposed with a first width W1 between the organic film cover CHC and the dam DAM1. The first width W1 may be smaller than the first gap G1 between the organic film cover CHC and the dam DAM1. For example, the first gap G1 may be approximately 180 μm to 220 μm, and the first width W1 may be approximately 50 μm to 150 μm. For another example, the first gap G1 may be approximately 190 μm to 200 μm, and the first width W1 may be approximately 70 μm to 100 μm. The first width W1 may be equal to the first gap G1 minus the sum of the second gap G2 and the third gap G3, which will be described later. According to an embodiment of the present disclosure, the alignment marks AM1 and AM2 may be disposed between the edges of the first inorganic film 191 and/or the second inorganic film 193 and the dam DAM1. In some embodiments, the second mark AM2 (to be described later) may be disposed wider than the width between the edges of the first inorganic film 191 and/or the second inorganic film 193 and the dam DAM1 so that a part of it may flow down along the side surfaces of the first inorganic film 191 and/or the second inorganic film 193.

The alignment marks AM1 and AM2 may be disposed to be spaced apart from the organic film cover CHC by the second gap G2. The second gap G2 may be the gap between at least one of the edge of the first inorganic film 191 and the edge of the second inorganic film 193 and the organic film cover CHC. For example, the first gap G1 may be approximately 40 μm to 60 μm. For another example, the second gap G2 may be approximately 50 μm.

The alignment marks AM1 and AM2 may be disposed to be spaced apart from the dam DAM1 by the third gap G3. According to an embodiment of the present disclosure, the third gap G3 may be equal to the second gap G2. For example, the third gap G3 may be approximately 40 μm to 60 μm. For another example, the third gap G3 may be approximately 50 μm. In some embodiments, the third gap G3 may be larger or smaller than the second gap G2.

The alignment marks AM1 and AM2 may be disposed to be spaced apart from the edge of the display panel 200 by a fourth gap G4. The edge of the display panel 200 may be the edge of the substrate SUB. The fourth gap G4 may be larger than the second gap G2 and/or the third gap G3. The fourth gap G4 may be smaller than the first gap G1. For example, the fourth gap G4 may be approximately 160 μm to 180 μm.

The alignment marks AM1 and AM2 may be disposed to be spaced apart from the display area DA by a fifth gap G5. The fifth gap G5 may be larger than the first gap G1 to the fourth gap G4. According to an embodiment of the present disclosure, the fifth gap G5 may be 500 μm to 600 μm.

Referring to FIGS. 10 and 11, as described above, the alignment marks AM1 and AM2 may include the first mark AM1 and the second mark AM2.

The first mark AM1 and the second mark AM2 may be disposed on two different layers among a plurality of layers of the display panel 200, respectively. The second mark AM2 may be disposed on above the first mark AM1. According to an embodiment of the present disclosure, the first mark AM1 may be disposed on a first layer, and the second mark AM2 may be disposed on a second layer disposed above the first layer. The second layer may be disposed directly on the first layer, or at least one other layer may be disposed between the first layer and the second layer. In some embodiments, the second layer may be located below the first layer. In some embodiments, the first mark AM1 and the second mark AM2 may be disposed on the same layer among a plurality of layers of the display panel 200.

The first layer may be disposed between other layers forming the display panel 200. Accordingly, the first mark AM1 may be disposed between the plurality of layers forming the display panel 200 and may not be exposed.

No other layer may be disposed on at least a part of the upper surface of the second layer. At least a part of the second layer may be exposed. Accordingly, the second mark AM2 may be exposed to the upper side. The second layer may be the uppermost layer among a plurality of layers forming the display panel 200.

According to an embodiment of the present disclosure, the first layer may be the gate insulator 130 and the second layer may be the second inorganic film 193. Specifically, the first mark AM1 may be disposed between the gate insulator 130 and the first interlayer dielectric layer 141, and the second mark AM2 may be disposed on the second inorganic film 193 so that it is exposed to the upper side.

The layer and the alignment mark AM disposed on the first layer and the second layer may include the same material. The alignment marks AM may be formed together with a layer disposed on the layer on which the alignment marks AM are disposed. Specifically, the first mark AM1 and the layer disposed on the first layer may be formed together, and the second mark AM2 and the layer disposed on the second layer may be formed together. The layers including the same material as the material of the alignment marks AM may be at least one of: a light-blocking layer BML, an active layer ACT, a gate electrode G, a source electrode S, a drain electrode D, a first power connection line VSEL, a first supply voltage line VSSL, a first light-emitting electrode 171, a second light-emitting electrode 173, a sensing line TL, and a sensing electrode TE. For example, the material may include a metal material such as at least one of: indium (In), gallium (Ga), zinc (Zn), tin (Sn), zirconium (Zr), hafnium (Hf), cadmium (Cd), nickel (Ni), copper (Cu), molybdenum (Mo), aluminum (Al), chromium (Cr), gold (Au), titanium (Ti), nickel (Ni), neodymium (Nd) and copper (Cu), and alloys thereof. Each of the alignment marks AM may be made up of a single layer or multiple layers. According to an embodiment of the present disclosure, the first mark AM1 may be formed together with the gate electrode G, and the second mark AM2 may be formed together with the sensing electrode TE or the sensing line TL.

Referring to FIGS. 10 and 11, according to an embodiment of the present disclosure, a plurality of first marks AM1 and a plurality of second marks AM2 may be disposed so that they do not overlap each other in the third direction Z. In some embodiments, the first marks AM1 and the second marks AM2 may be disposed to overlap each other in the third direction Z.

The first marks AM1 and the second marks AM2 may be arranged alternately. According to an embodiment of the present disclosure, three first marks AM1 may be disposed between two second marks AM2. In some embodiments, one second mark AM2 and three first marks AM1 may be arranged alternately.

The first marks AM1 and the second marks AM2 may be spaced apart from one another in the first direction X and/or the second direction Y. For example, the first marks AM1 and the second marks AM2 may be spaced apart from one another by 100 μm to 300 μm. The gap between the first marks AM1 and the second marks AM2 may be equal to the gap between the first marks AM1 or the gap between the second marks AM2. In some embodiments, the gap between the first marks AM1 and the second marks AM2 may be greater than the gap between the second marks AM2.

The first marks AM1 and the second marks AM2 may have various shapes such as a triangle, a square, a diamond and a cross. The first marks AM1 and the second marks AM2 may have different shapes. The length of each of the first marks AM1 and/or the second marks AM2 may be equal to or greater than the width.

The first marks AM1 and the second marks AM2 may have different sizes. The size of the second marks AM2 may be larger than the size of the first marks AM1. Specifically, the second marks AM2 are formed on the inorganic film of the encapsulation layer TFE which have a wider space than the substrate SUB or the thin-film transistor layer TFTL where various lines or elements are disposed. Accordingly, the second marks AM2 can be formed larger than the first marks AM1. Accordingly, the second marks AM2 can be recognized more easily than the first marks AM1. The first marks AM1 and the second marks AM2 may have the same width but the length L1 of the first marks AM1 may be smaller than the length L2 of the second marks AM2. For example, the widths of the first mark AM1 and the second mark AM2 may range approximately from 70 μm to 100 μm. For another example, the length L1 of the first marks AM1 may be equal to or less than approximately 300 μm, and the length L2 of the second marks AM2 may be greater than approximately 300 μm. For another example, the length L2 of the second marks AM2 may range approximately from 330 μm to 360 μm.

The display device 10 according to an embodiment of the present disclosure can reduce distortion of the alignment marks AM. Specifically, when the alignment marks AM are disposed between multiple layers, distortion may occur due to the boundaries of the multiple layers. For example, when the first mark AM1 are formed to overlap the edges of the first inorganic film 191 and/or the second inorganic film 193, the first marks AM1 may be distorted so that it may be difficult for the cameras VC to recognize the first marks AM1 or an error is likely to occur. In this regard, by disposing the second marks AM2 on the uppermost layer among the plurality of layers forming the display module, for example, the second inorganic film 193, the cameras VC can recognize the second marks AM2 to correct the error. Since the second marks AM2 are exposed to the upper side, distortion due to boundaries of other layers can be reduced. On the other hand, as the second marks AM2 are disposed on the first inorganic film 191 and the second inorganic film 193, a part of the second marks AM2 may flow down along the side surfaces of the first inorganic film 191 and the second inorganic film 193. Accordingly, there is the possibility that the second marks AM2 are distorted. When this happens, it is possible to correct an error due to the distortion of the second marks AM2 with reference to the first marks AM1. Since the first marks AM1 are disposed flat on the gate insulator 130 or the like, distortion due to the flowing is less likely to occur than the second marks AM2. That is to say, the first marks AM1 and the second marks AM2 may work complementarily. Furthermore, the camera VC may be disposed on the upper surface (or front surface) and/or lower surface (or rear surface) of the display panel 200, and the first marks AM1 and the second marks AM2 can be used selectively, whichever has less distortion. Hereinafter, the alignment notches AH of the cover panel 300 will be described in detail with reference to FIGS. 12 and 14.

Figure 12:
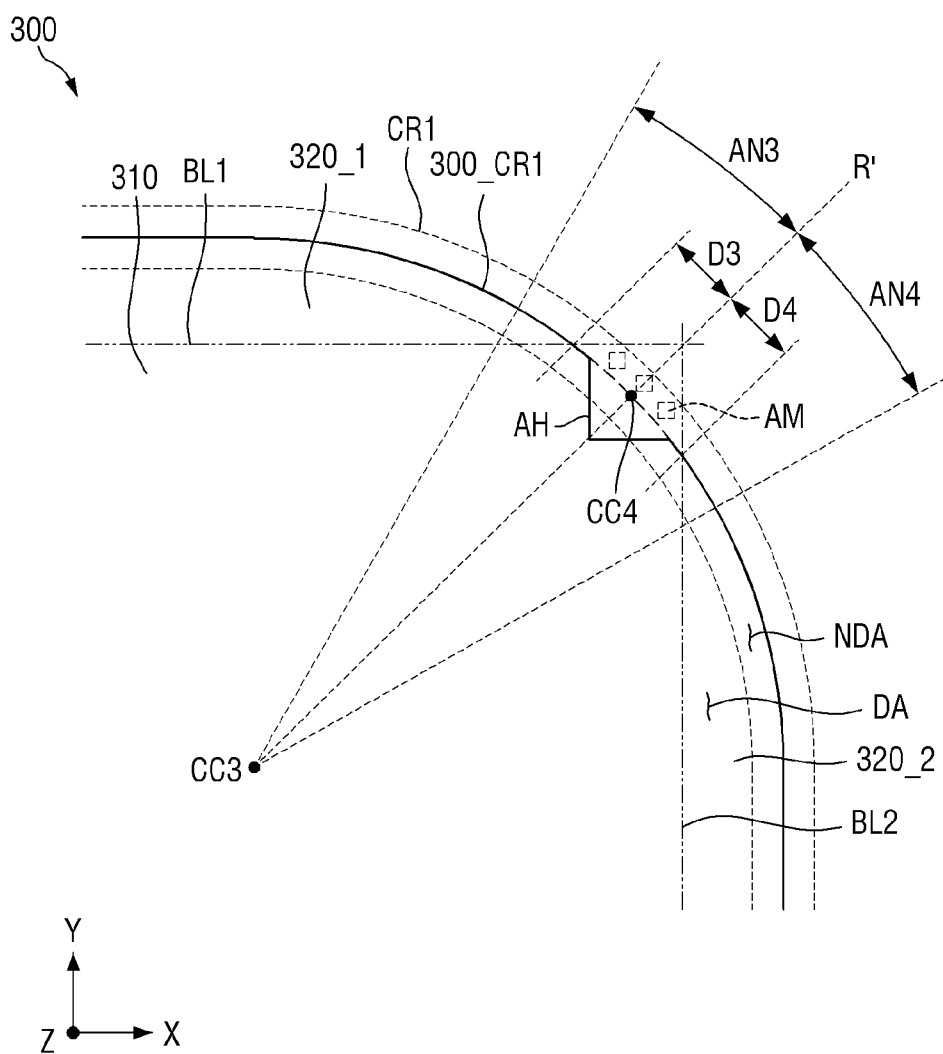
FIG. 12 is an enlarged plan view of a first corner of a cover panel of a display device according to an embodiment of the present disclosure before a side surface is bent.
Figure 13:
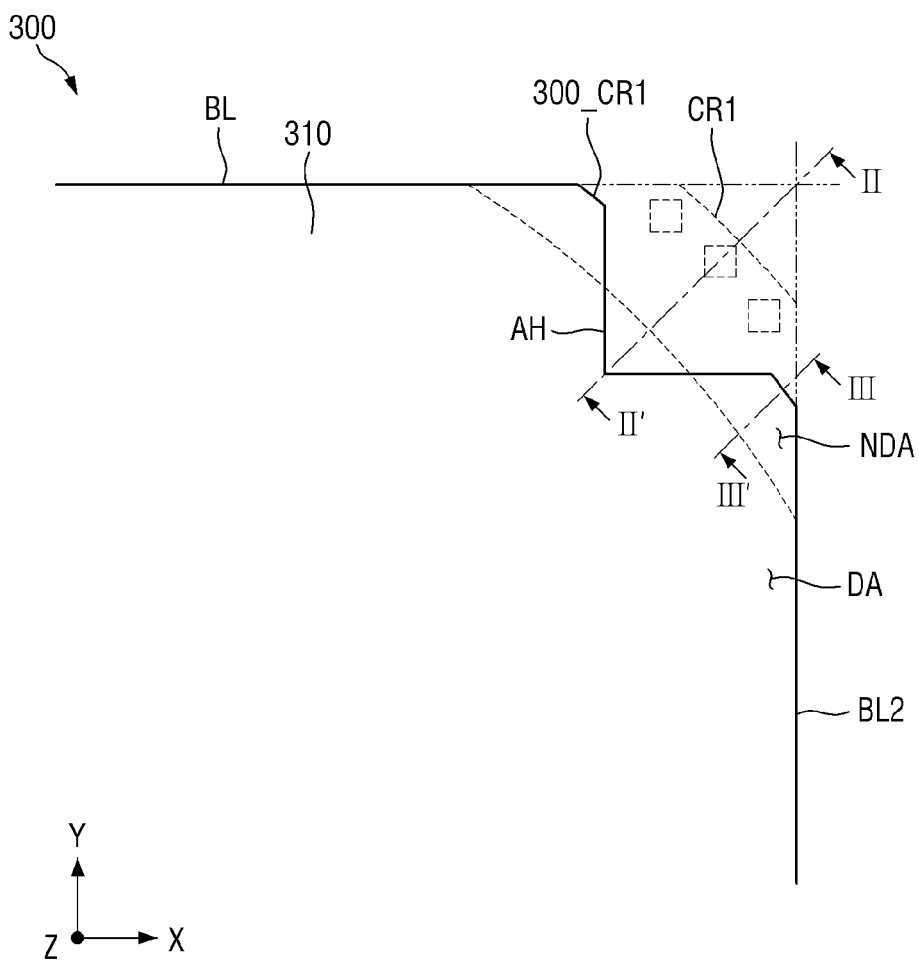
FIG. 13 is an enlarged plan view of a first corner of a display panel of a display device according to an embodiment of the present disclosure after a side surface is bent.
Figure 14:
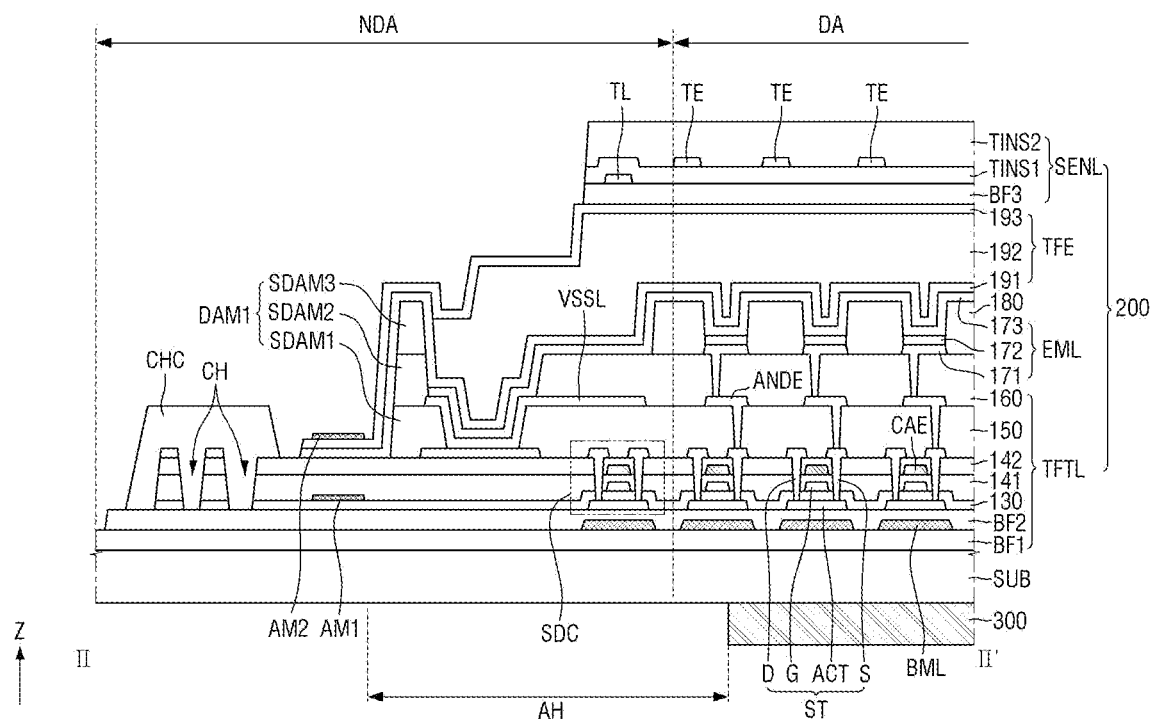
FIG. 14 is a cross-sectional view taken along line II-II' of FIG. 13.
Figure 15:
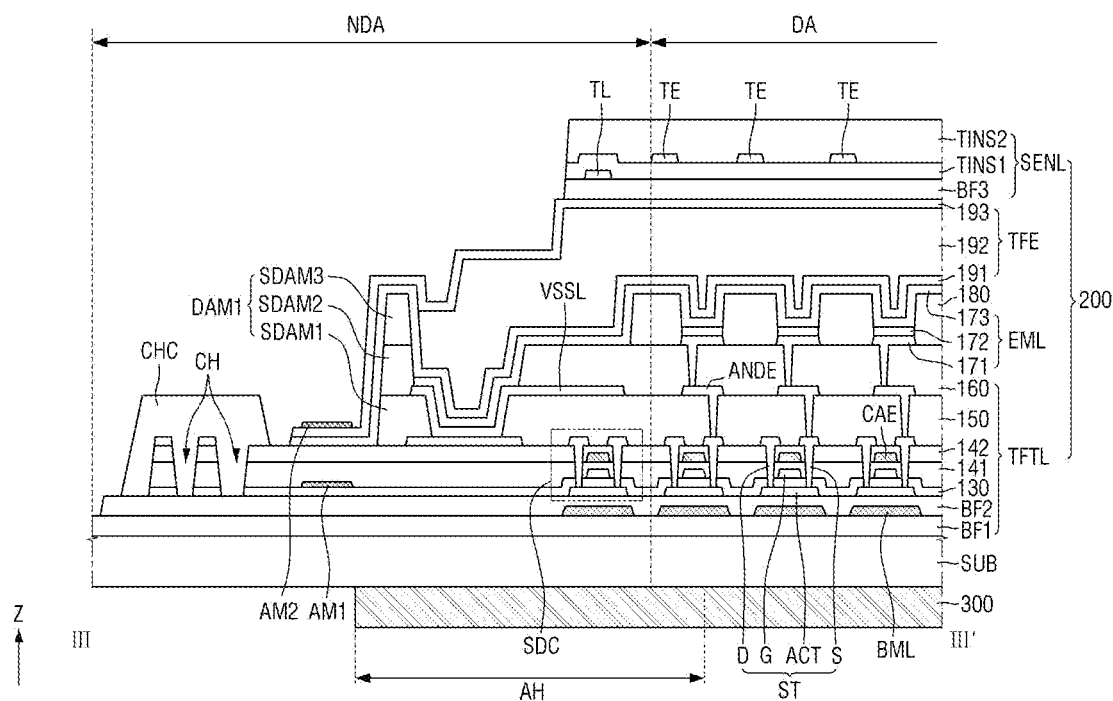
FIG. 15 is a cross-sectional view taken along line III-III' of FIG. 13.

FIG. 12 is an enlarged plan view of a first corner of a cover panel of a display device according to an embodiment of the present disclosure before a side surface is bent. FIG. 13 is an enlarged plan view of a first corner of a display panel of a display device according to an embodiment of the present disclosure after a side surface is bent. FIG. 14 is a cross-sectional view taken along line II-II' of FIG. 13. FIG. 15 is a cross-sectional view taken along line III-III' of FIG. 13.

The alignment notches AH defined at the second corner 300_CR2, the third corner 300_CR3 and the fourth corner 300_CR4 of the display panel 300 are substantially identical or similar to the alignment notches AH defined at the first corner 300_CR1, and thus only the alignment notches AH defined at the first corner 300_CR1 will be described.

Referring to FIG. 12, as described above, an alignment notch AH may be defined at the first corner 300_CR1. Specifically, an alignment hole may be formed in a center area CA' of the first corner 300_CR1.

The center area CA' of the first corner 300_CR1 may not be distorted or may be less distorted than other areas when the side surfaces 320 of the cover panel 300 are bent. Accordingly, it is possible to identify the alignment notches AH even though the side surfaces 320 of the cover panel 300 are bent, unlike the alignment notches disposed in a straight line area at the edge of the side surfaces 320 of the cover panel 300, etc. The center area CA' of the first corner 300_CR1 may be located so that it overlaps at least one of the display area DA and the non-display area NDA of the display panel 200 in the thickness direction. According to an embodiment of the present disclosure, the alignment notch AH may be defined so that it overlaps the non-display area NDA disposed along the edge of the display panel 200 and the display area DA adjacent to it in the thickness direction. In some embodiments, the alignment notch AH may be defined so that is overlaps only the non-display area NDA of the display panel 200. In some embodiments, the center area CA' of the first corner 300_CR1 may at least partially overlap the center area CA of the display panel 200.

The center area CA' of the first corner 300_CR1 may be located on the inner side of the bending lines. Specifically, the center area CA' of the first corner 300_CR1 may be an area of the first corner 300_CR1 that is located on the inner side of the first bending line BL1 and the second bending line BL2. The inner side may refer to the side closer to the center of the substrate SUB. According to an embodiment of the present disclosure, the center area CA' of the first corner 300_CR1 may be a part of the first corner 300_CR1 that is not bent downward. In some embodiments, the center area CA' of the first corner 300_CR1 may be bent together with the first side surface 320_1 and the second side surface 320_2 when they are bent in the thickness direction. Accordingly, the alignment notches AH may also be bent in the thickness direction. The center area CA' of the first corner 300_CR1 may be less bent than the first side surface 320_1 and the second side surface 320_2. For example, a difference in height between the center area CA' of the first corner 300_CR1 and the center portion of the front surface 310 of the cover panel 300 may range approximately from 0.2 mm to 0.8 mm.

The center area CA' of the first corner 300_CR1 may lie within a predetermined range from the center of the first corner 300_CR1. The center area CA' of the first corner 300_CR1 may be spaced apart from the shorter sides of the substrate SUB extended in the first direction X and the longer sides thereof in the second direction Y. The size of the center area CA' of the first corner 300_CR1 may be approximately one-fourth the size of the first corner 300_CR1. The center area CA' of the first corner 300_CR1 may lie within a predetermined range from a reference line R'. The reference line R' may be a virtual line passing through a center CC4 of the first corner 300_CR1 and a center of curvature CC3 of the first corner 300_CR1. The center of the first corner 300_CR1 may be a point that equally divides an arc of the edge of the first corner 300_CR1. The reference line R' may form a predetermined angle with the first bending line BL1 and/or the second bending line BL2. For example, the predetermined angle may be approximately 30° to 60°. For another example, the predetermined angle may be approximately 45°.

The center area CA' of the first corner 300_CR1 may lie within a predetermined distance range from the reference line R'. According to an embodiment of the present disclosure, the center area CA' of the first corner 300_CR1 may be located within a third distance D3 from the reference line R' counterclockwise, and within a fourth distance D4 from the reference line R' clockwise. The third distance D3 may be equal to or different from the fourth distance D4. For example, the third distance D3 and the fourth distance D4 may be larger than 0 mm and equal to or less than 1 mm. For another example, the third distance D3 may be larger than 0 mm and equal to or less than 0.5 mm, and the fourth distance D4 may be larger than 0 mm and equal to or less than 1.5 mm. The radius of curvature of the arc of the first corner 300_CR1 may be approximately 8 mm to 12 mm, and the length of the arc of the first corner 300_CR1 may be approximately 15 mm to 20 mm.

The center area CA' of the first corner 300_CR1 may lie within a predetermined angle range from the reference line R'. According to an embodiment of the present disclosure, the center area CA' of the first corner 300_CR1 may be located within an area covered within a third angle AN3 from the reference line R' counterclockwise, and within a fourth angle AN4 from the reference line R' clockwise, with respect to the curvature radius of the first corner 300_CR1. The third angle AN3 may be equal to or different from the fourth angle AN4. For example, the third angle AN3 and the fourth angle AN4 may be greater than approximately 0° and less than 15°. For another example, the third angle AN3 may be greater than approximately 0° and equal to or less than 15°, and the fourth angle AN4 may be greater than 0° and equal to or less than 30°. For another example, the third angle AN3 and the fourth angle AN4 may be approximately 11.25°.

The alignment notch AH may be defined in an L-shape or a V-shape at the first corner 300_CR1 of the cover panel 300. According to an embodiment of the present disclosure, the alignment notch AH may include, but is not limited to, straight portions in different directions. In some embodiments, the alignment notch AH may include a curved portion.

The alignment notch AH and the alignment marks AM may have different sizes. The size of alignment notch AH is an area of a region outlined by borders of the alignment notch AH and a virtual corner line made by extending corner lines of the cover panel 300 adjacent to the alignment notch AH. According to an embodiment of the present disclosure, the alignment notch AH may be larger than the alignment marks AM. For example, the length of the straight portion in the first direction X and the length of the straight portion in the second direction Y of the alignment notch AH may be approximately 0.5 mm to 2.5 mm. The straight portion in the first direction X and the straight portion in the second direction Y may have the same length or different lengths. In some embodiments, the size of the alignment notch AH may be equal to or smaller than the size of the alignment marks AM.

The alignment notch AH may be defined more to the inside than the alignment marks AM. According to an embodiment of the present disclosure, as the cover panel 300 has a size smaller than that of the display panel 200, the alignment notch AH is formed on the inner side with respect to the edge of the first corner 300_CR1 of the cover panel 300 while the alignment marks AM may be disposed on the outer side. According to an embodiment of the present disclosure, the alignment notch AH and the alignment marks AM may not overlap each other in the thickness direction. In some embodiments, the alignment notch AH and the alignment marks AM may overlap each other at least partially in the thickness direction.

Referring to FIG. 13, the display device 10 can allow the alignment notches AH of the cover panel 300 that is bent along bending lines in different directions to be recognized more easily. Specifically, during the process of assembling the cover panel 300 and the display panel 200, cameras for determining whether they are aligned correctly are typically placed on the front or rear surface of the cover panel 300. When the alignment notches AH are formed between the corners of the cover panel 300, for example, in the straight extended portion of the side surfaces 320 of the cover panel 300, it may be difficult to be recognize the alignment notches AH by the cameras due to bending of the side surfaces 320, or distortion due to the bending is likely to occur. In contrast, as shown in FIG. 13, the alignment notches AH of the display device 10 according to an embodiment of the present disclosure are disposed at the center area CA' of the first corner 300_CR1, so that distortion due to bending is reduced even when the first side surface 320_1 and the fourth side surface 320_4 of the cover panel 300 adjacent thereto are bent. Accordingly, it is possible to easily recognize the alignment notches AH by the cameras.

In addition, the alignment notches AH are disposed at the first corner 300_CR1, the second corner 300_CR2, the third corner 300_CR3 and the fourth corner 300_CR4, respectively, so that they are spaced apart from one another as much as possible. This allows for more precise alignment compared to the alignment notches disposed between the corners of the substrate when an error has occurred.

Referring to FIGS. 14 and 15, the cover panel 300 may be attached on the rear surface of the substrate SUB of the display panel 200.

Referring to FIG. 14, the first corner 300_CR1 of the cover panel 300 may overlap with at least a part of the thin-film transistor layer TFTL, the emission material layer EML, the encapsulation layer TFE and/or the sensor electrode layer SENL of the display panel 200. For example, as shown in FIG. 14, the cover panel 300 may be disposed so that it overlaps at least one of: the scan driver SDC, the thin-film transistor ST, the first organic film 150, the first connection electrode ANDE, the second organic film 160, the light-blocking layer BML, the first light-emitting electrode 171, the organic light-emitting layer 172, the second light-emitting electrode 173, the bank 180, the organic film 190, the third buffer film BF3, the sensing line TL, the first sensor insulating layer TINTS1, the sensing electrode TE, and the second sensor insulating layer TINTS2 disposed on the front side. According to an embodiment of the present disclosure, the cover panel 300 may be disposed not to overlap with at least one of the dam DAM1, the anti-crack hole CHC, the organic film cover CHC, and the alignment marks AM. It is, however, to be understood that the present disclosure is not limited thereto.

Referring to FIG. 15, as described above, the alignment notch AH may be disposed so that it does not overlap the alignment mark AM in the thickness direction. According to an embodiment of the present disclosure, the alignment notches AH may overlap in the thickness direction the elements of the display panel 200 located at the edges of the display area DA, e.g., at least one of: the scan driver circuit SDC, the thin-film transistor ST, the end of first organic film 150, the first connection electrode ANDE, the end of the second organic film 160, the light-blocking layer BML, the first light-emitting electrode 171, the organic light-emitting layer 172, the second light-emitting electrode 173, the bank 180, the end of the organic film 190, the end of the third buffer film BF3, the sensing line TL, the end of the first sensor insulating film TINS1, the sensing electrode TE and the end of the second sensor insulating film TINS2. That is to say, a portion of the edge of the display area DA of the display panel 200, e.g., pixels defined by the light-emitting layer 172 and the bank 180 may not covered in the area where the alignment notches AH are disposed. Accordingly, a part of the display area of the display panel 200 may be exposed through the alignment notch AH. In some embodiments, the alignment notch AH may be disposed to overlap only the non-display area NDA of the display panel 200, and the display area DA around the alignment notch AH may be completely covered by the cover panel 300.

Figure 16:
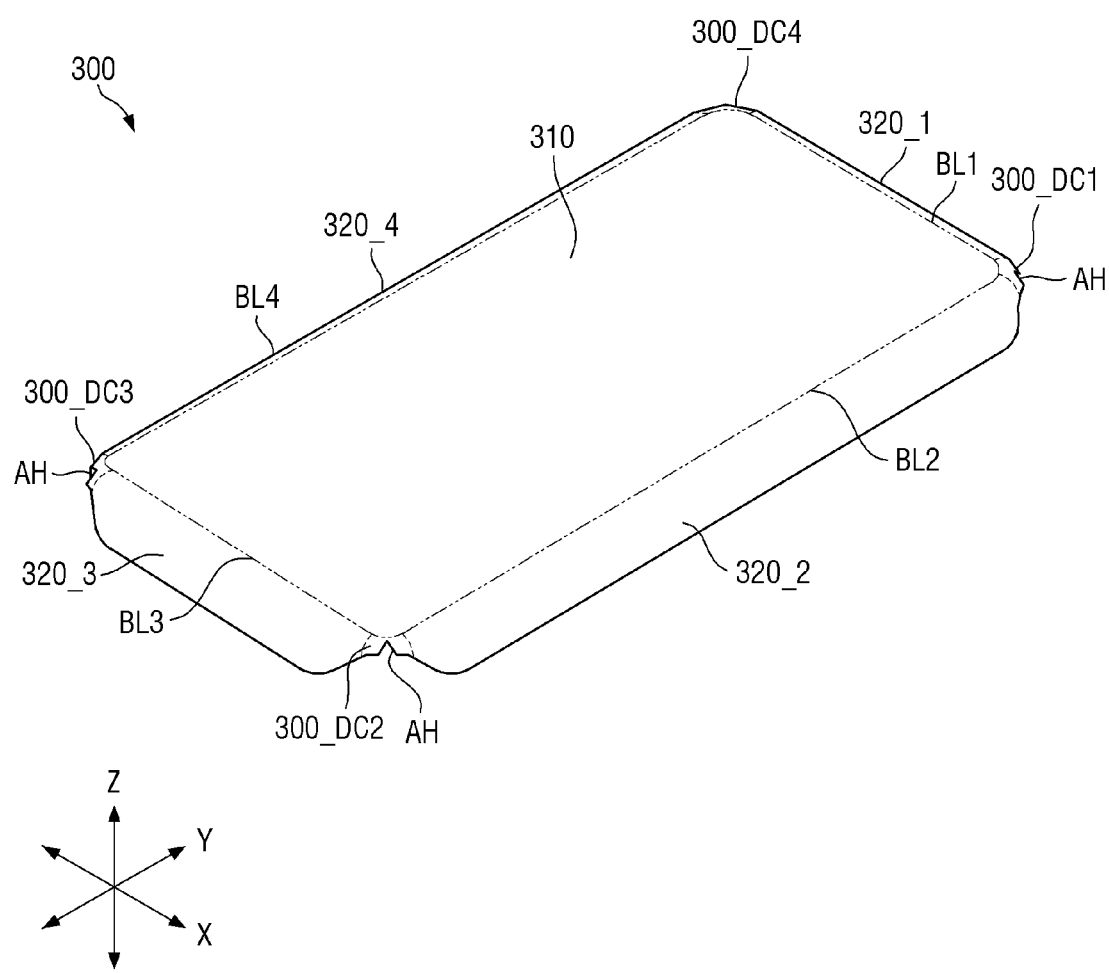
FIG. 16 is a perspective view of a cover panel of a display device according to another embodiment of the present disclosure.
Figure 17:
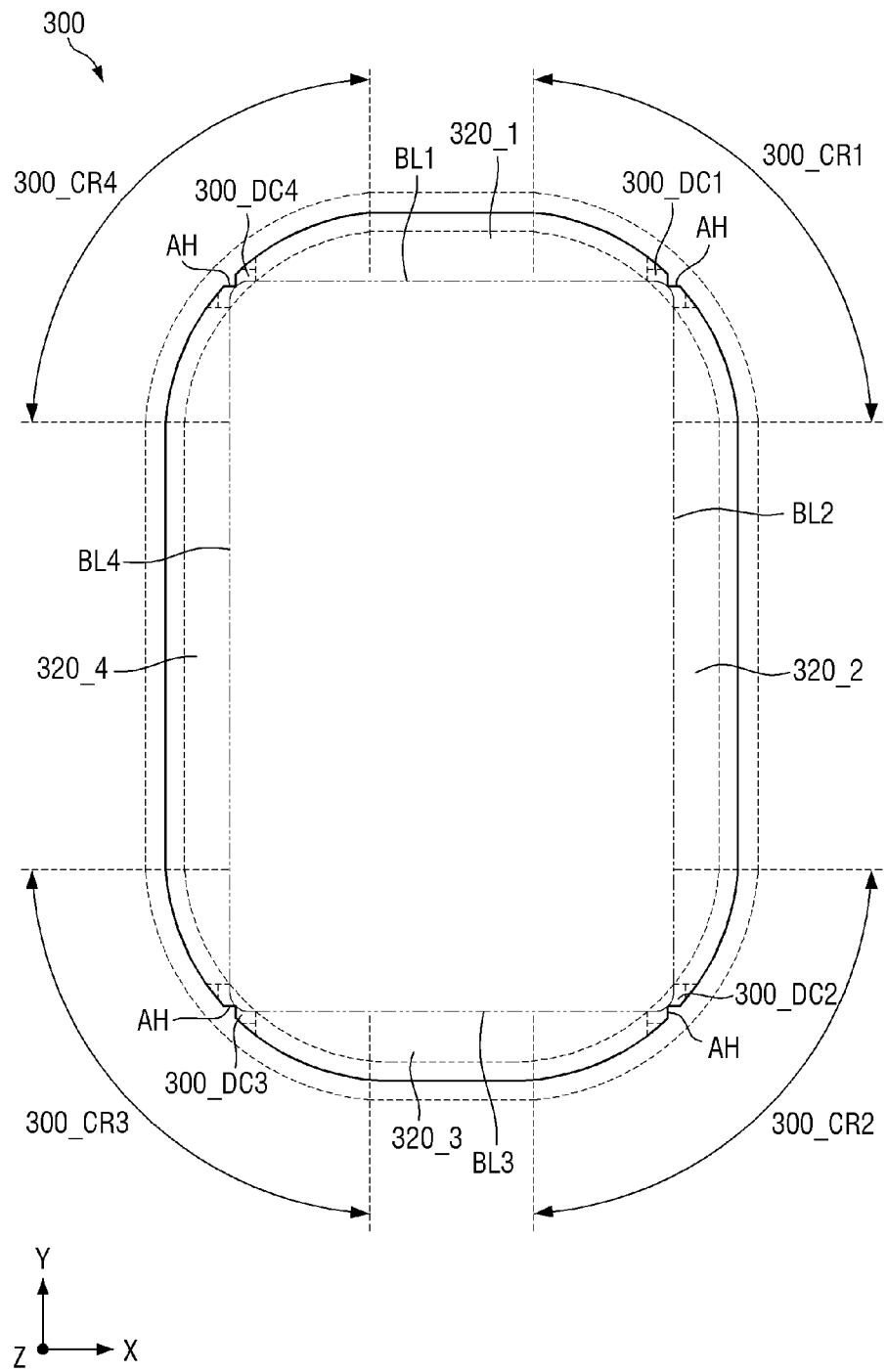
FIG. 17 is a plan view of a cover panel of a display device according to another embodiment of the present disclosure when it is unfolded.
Figure 18:
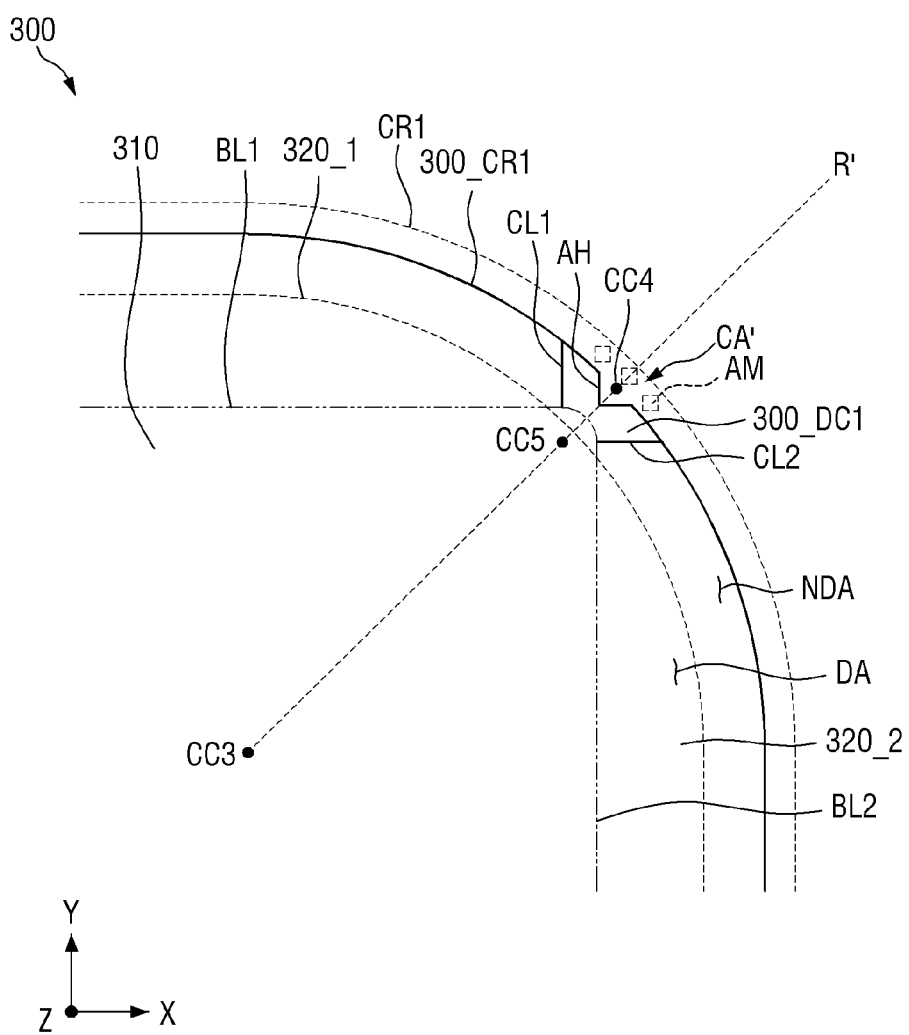
FIG. 18 is an enlarged plan view of a first corner of a cover panel of a display device according to another embodiment before the side surface is bent.
Figure 19:
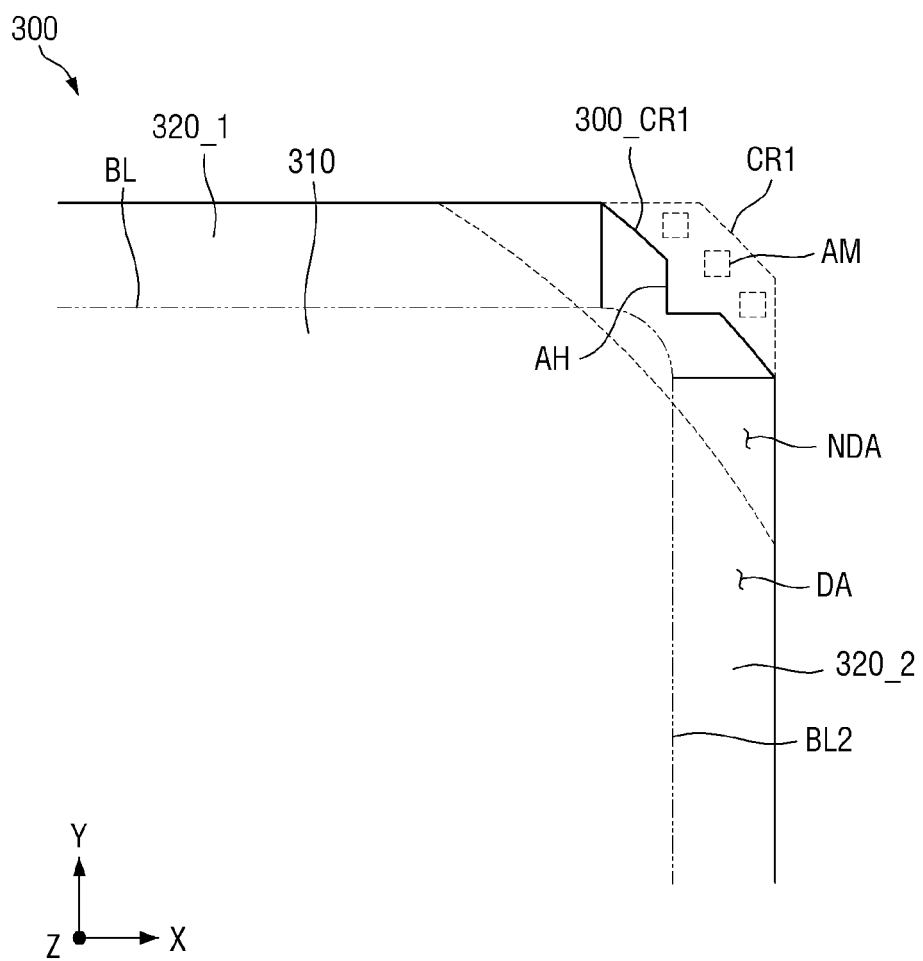
FIG. 19 is an enlarged plan view of a first corner of a display panel of a display device according to another embodiment of the present disclosure after a side surface is bent.

FIG. 16 is a perspective view of a cover panel of a display device according to another embodiment of the present disclosure. FIG. 17 is a plan view of a cover panel of a display device according to another embodiment of the present disclosure when it is unfolded. FIG. 18 is an enlarged plan view of a first corner of a cover panel of a display device according to another embodiment before the side surface is bent. FIG. 19 is an enlarged plan view of a first corner of a display panel of a display device according to another embodiment of the present disclosure after a side surface is bent.

The embodiment of FIG. 16 is different from the embodiment of FIG. 1 in that a cover panel 300 further includes double curvature portions 300_DC. Referring to FIGS. 16 and 17, the cover panel 300 may further include double curvature portions 300_DC disposed at the corners, respectively.

The double curvature portions 300_DC may be disposed between the side surfaces 320. The double curvature portions 300_DC may connect the corners with the respective adjacent side surfaces 320 of the front surface. The double curvature portions 300_DC may have a convex shape. The double curvature portions 300_DC may be bent or curved in the thickness direction to have two or more curvatures. The curvature of the double curvature portions 300_DC may be smaller than the overall curvature of the side surfaces 320. The curvature of the double curvature portions 300_DC may be equal to the curvature of a part of the side surfaces 320 that is adjacent to the edge of the front surface 310. The double curvature portions 300_DC may be formed as the first bending line BL1 to the fourth bending line BL4 serving as references for bending of the side surfaces 320 are disposed more to the inside than the edges of the cover panel 300. It is, however, to be understood that the present disclosure is not limited thereto.

Hereinafter, for convenience of illustration, the double curvature portions 300_DC disposed at the four corners of the cover panel 300 are be referred to as a first double curvature portion 300_DC1, a second double curvature portion 300_DC2, a third double curvature portion 300_DC3, and a fourth double curvature portion 300_DC4, respectively. The first double curvature portion 300_DC1 may be disposed between the first side surface 320_1 and the second side surface 320_2, the second double curvature portion 300_DC2 may be disposed between the second side surface 320_2 and the third side surface 320_3, the third double curvature portion 300_DC3 may be disposed between the third side surface 320_3 and the fourth side surface 320_4, and the fourth double curvature portion 300_DC4 may be disposed between the fourth side surface 320_4 and the first side surface 320_1.

The alignment notches AH may be formed at the first double curvature portion 300_DC1 to the fourth double curvature portion 300_DC4, respectively. The alignment notches AH may have an L- or V-shape formed by removing a part of the edges of the first double curvature portion 300_DC1 to the fourth double curvature portion 300_DC4. The alignment notches AH may have a shape formed by cutting off a part of the first double curvature portion 300_DC1 to the fourth double curvature portion 300_DC4.

Referring to FIGS. 18 and 19, the first corner 300_CR1 of the cover panel 300 may include the first double curvature portion 300_DC1. Similar to the embodiments of FIGS. 12 and 13, the alignment notch AH may be disposed in the center area CA' of the first double curvature portion 300_DC1. The center area CA' of the first double curvature portion 300_DC1 is defined by the center of the first corner 300_CR1, the center of curvature of the first corner 300_CR1, and/or the center of curvature of the corner of the bending line formed as the first bending line BL1 and the second bending line BL2. The center area CA' of the first double curvature portion 300_DC1 may be defined with respect to the reference line R' in substantially the same manner as or a similar manner to the center area CA' of the first corner 300_CR1 of FIGS. 12 and 13.

The alignment notch AH may be formed to overlap at least one of the display area DA and the non-display area NDA of the display panel 200 in the thickness direction. According to an embodiment of the present disclosure, the alignment notch AH may be formed to overlap only the non-display area NDA.

The alignment notch AH may be formed on the outer side of the first bending line BL1 and the second bending line BL2. The outer side may refer to the outer side of the closed area formed by the first bending line BL1 and the fourth bending line BL4.

The cover panel 300 may further include cutting lines CL1 and CL2 between the double curvature portions 300_DC and the side surfaces 320. The cutting lines CL1 and CL2 may be formed along the boundaries between the cover panel 300 and the double curvature portions 300_DC. For example, as shown in FIG. 18, the first cutting line CL1 may be formed between the first side surface 320_1 and the first double curvature portion 300_DC1, and the second cutting line CL2 may be formed between the second side surface 320_2 and the first double curvature portions 300_DC1. The alignment notch AH may be located between the first cutting line CL1 and the second cutting line CL2.

Referring to FIG. 19, even when the first side surface 320_1, the second side surface 320_2 and the first double curvature portion 300_DC1 of the cover panel 300 are bent, the alignment notch AH formed at the first double curvature portion 300_DC1 still can be recognized. This is because the curvature at which the first double curvature portion 300_DC1 is bent is smaller than the overall curvature at which the first side surface 320_1 and the second side surface 320_2 are bent. For example, the difference in height between the first double curvature portion 300_DC1 and the front surface may be approximately 0.2 mm to 0.8 mm. According to an embodiment of the present disclosure, as the bending angle and/or curvature of the first side surface 320_1 and the second side surface 320_2 increase and decrease, some areas of the first side surface 320_1 and the second side surface 320_2 adjacent to the front surface still can be viewed when viewed from the top. It is, however, to be understood that the present disclosure is not limited thereto.

Figure 20:
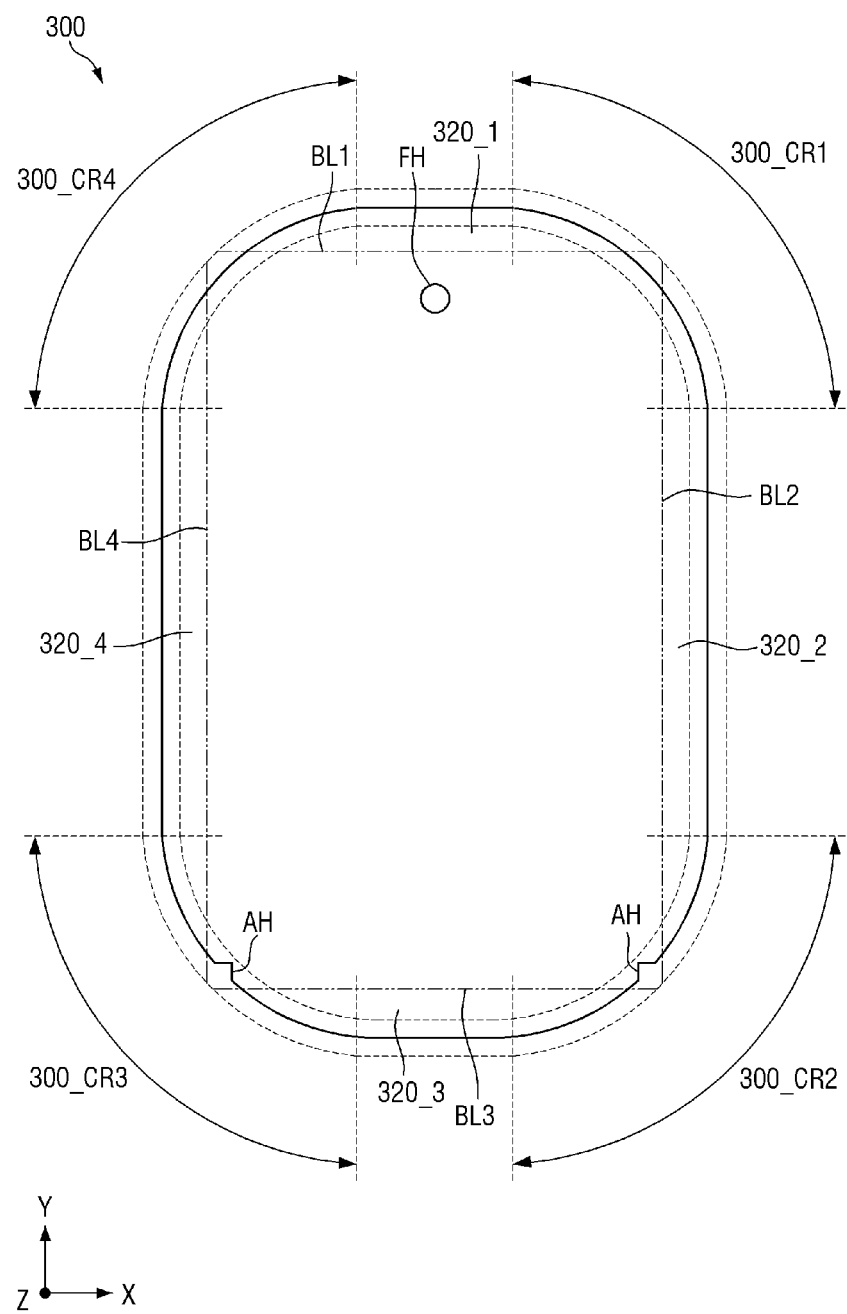
FIG. 20 is a plan view of a cover panel of a display device according to yet another embodiment of the present disclosure when it is unfolded.

FIG. 20 is a plan view of a cover panel according to yet another embodiment of the present disclosure when it is unfolded.

Referring to FIGS. 1 to 5, 7 to 11 and 20, the cover panel 300 may further include an alignment hole FH defined in the front surface 310.

The alignment hole FH may be defined to penetrate the cover panel 300 in the thickness direction. The alignment hole FH may be used as an identification mark for aligning the cover panel 300 along with the alignment notches AH.

The alignment hole FH may be defined on one side of the front surface 310 of the cover panel 300. The side of the front surface 310 may be a region adjacent to the first bending line BL1. Specifically, the distance from the alignment hole FH to the first bending line BL1 in the second direction Y may be smaller than each of the distances from the alignment hole FH to the other bending lines BL2, BL3, and BL4. The side of the front surface 310 may be a region adjacent to the first side surface 320_1. Specifically, the distance from the alignment hole FH to the first side surface 320_1 in the second direction Y may be smaller than each of the distances from the alignment hole FH to the other side surfaces 320_2, 320_3, and 320_4. In some embodiments, the side of the front surface 310 may be a region adjacent to the third bending line BL3 or the third side surface 320_3. In some embodiments, the side of the front surface 310 may be the center area of the front surface 310.

The alignment hole FH may be defined to overlap with at least one sensor in the plan view. Specifically, the display device 10 may include at least one sensor disposed at the rear of the cover panel 300, and the alignment hole FH may be defined to overlap at least one sensor in the thickness direction. The at least one sensor may include a variety of sensors such as an image sensor, an infrared sensor, an ultraviolet sensor, a temperature sensor, a distance sensor, and a motion sensor. For example, the alignment hole FH may be defined so that it overlaps in the thickness direction a camera unit disposed at the rear of the cover panel 300 and including an image sensor. In some embodiments, the alignment hole FH may include an opening for allowing a line or light of the display device 10 to pass through it, for example.

Although a circular alignment hole FH is depicted in FIG. 20, the shape of the alignment hole FH is not limited thereto. The alignment holes FH may be defined in various shapes such as an oval, a rectangle, a square and a triangle.

The alignment notch AH may be disposed only at the second corner 300_CR2 and the third corner 300_CR3 of the cover panel 300. In such case, the alignment notch AH may be disposed to overlap in the thickness direction only the non-display area NDA of the display panel 200. That is to say, the alignment notch AH may be located in the non-display area NDA of the display panel 200 when viewed from the top. In some embodiments, as described below, the alignment notches AH and alignment holes FH together may define at least three points which are the references for alignment. In some embodiments, the alignment notches AH may be formed only at the first corner 300_CR1 and the fourth corner 300_CR4 of the cover panel 300. In some embodiments, the alignment notches AH may be formed only at the first corner 300_CR1 and the second corner 300_CR2 of the cover panel 300, or only at the third corner 300_CR3 and the fourth corner 300_CR4. In some embodiments, the alignment notches AH may be formed only at the first corner 300_CR1 and the third corner 300_CR3 of the cover panel 300. The shape and arrangement of the alignment notches AH and the relationship with the alignment marks AM may be substantially identical to or similar to those of the embodiments of FIGS. 12 to 13.

The embodiment of FIG. 20 is substantially identical to or similar to the embodiment of FIG. 1 except that a cover panel 300 further includes an alignment hole FH; and, therefore, the redundant description will be omitted.

Figure 21:
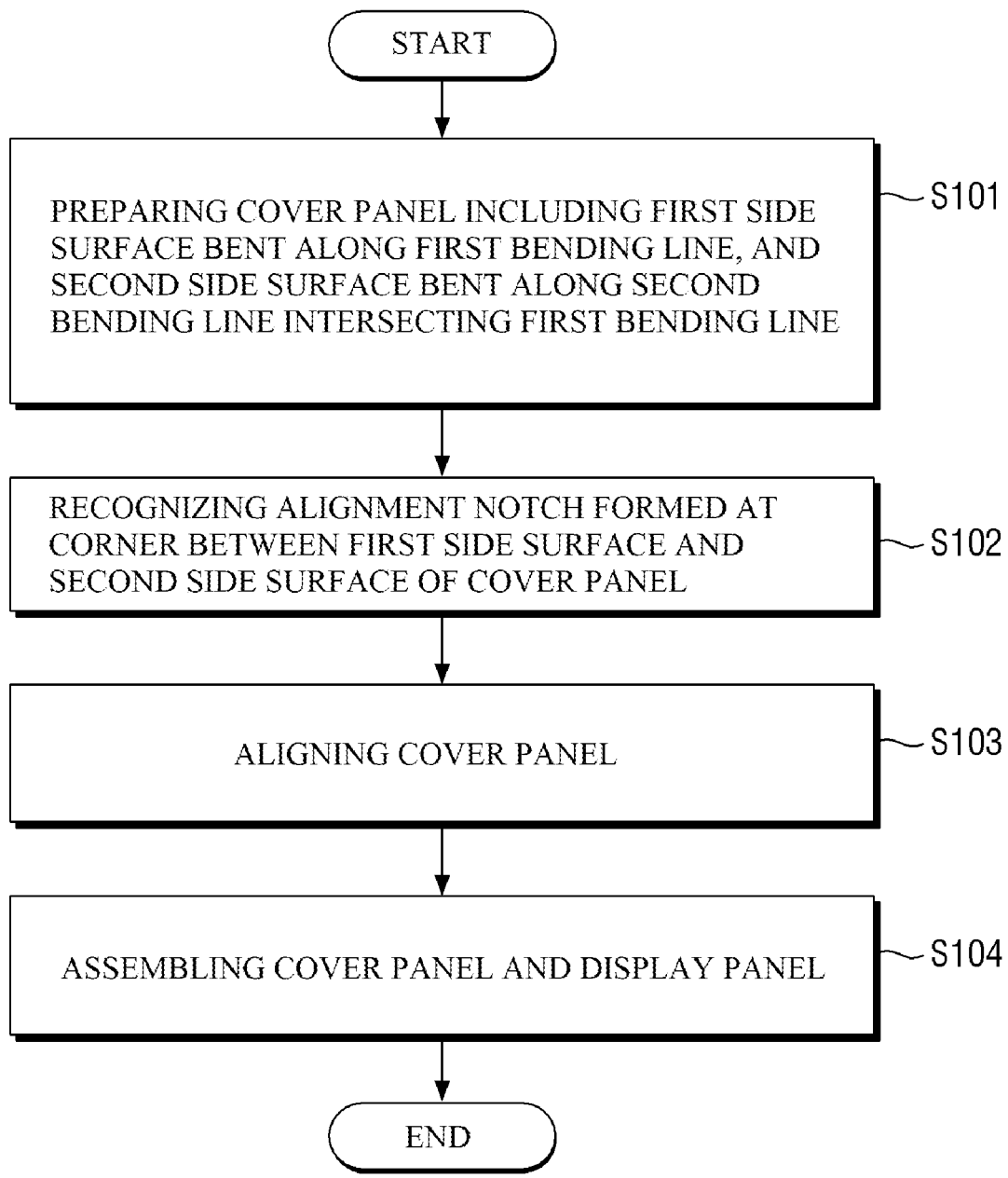
FIG. 21 is a flowchart for illustrating a method for fabricating a display device according to an embodiment of the present disclosure.
Figure 22:
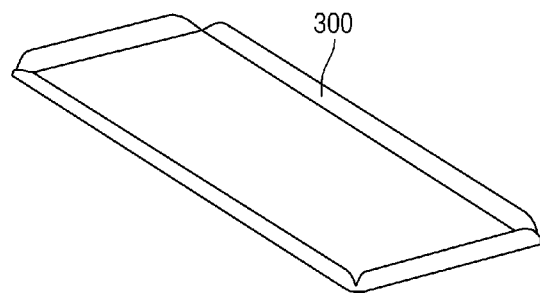
FIG. 22 is a view showing preparing a display panel and a cover panel.
Figure 22:
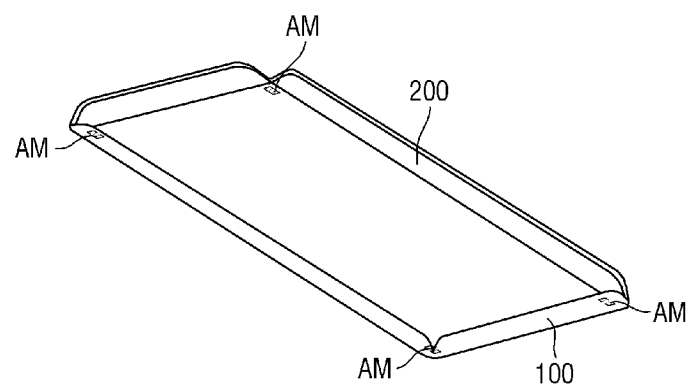
Figure 23:
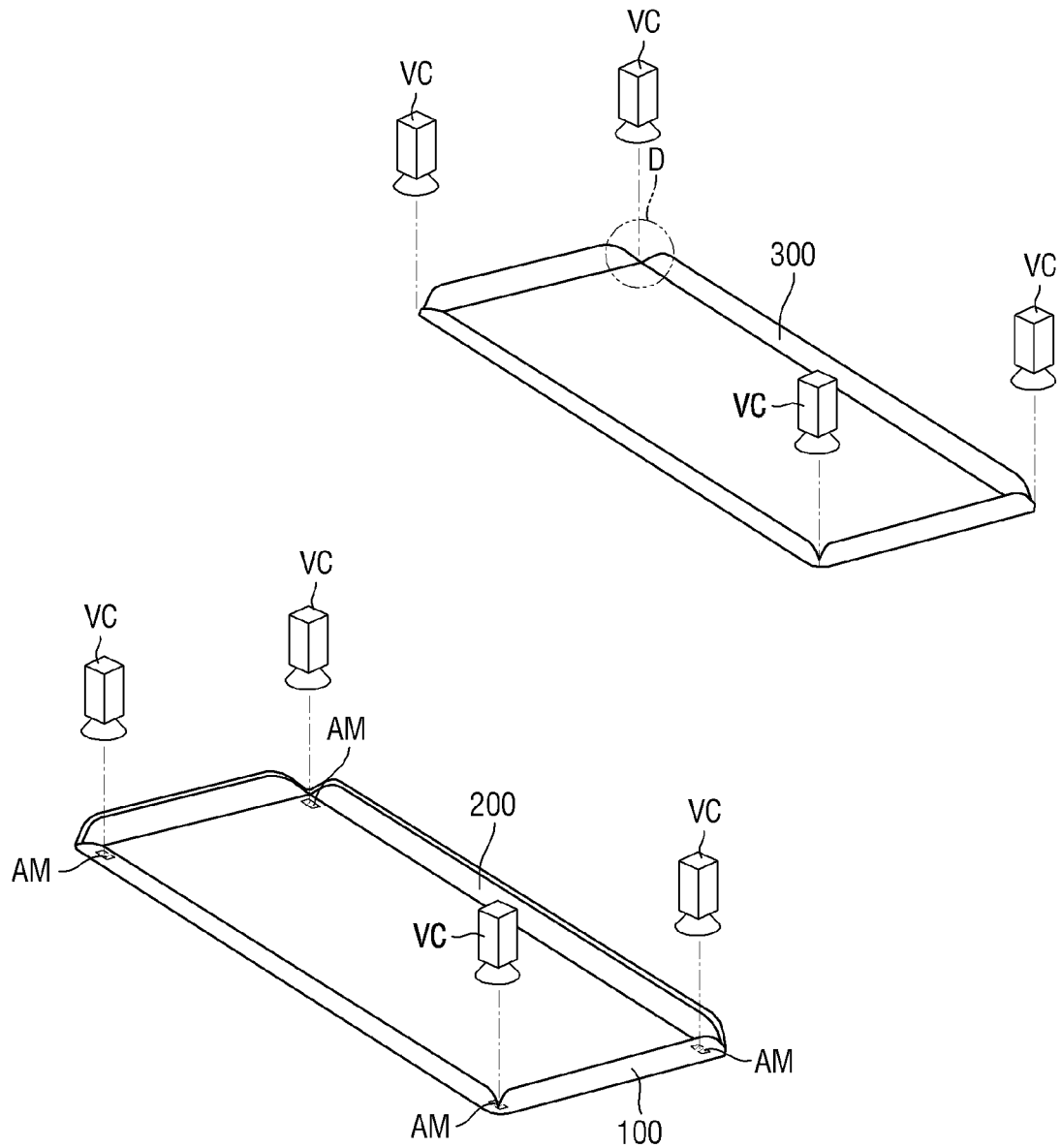
FIG. 23 is a view showing recognizing alignment marks of the display panel and alignment holes of the cover panel.
Figure 24A:
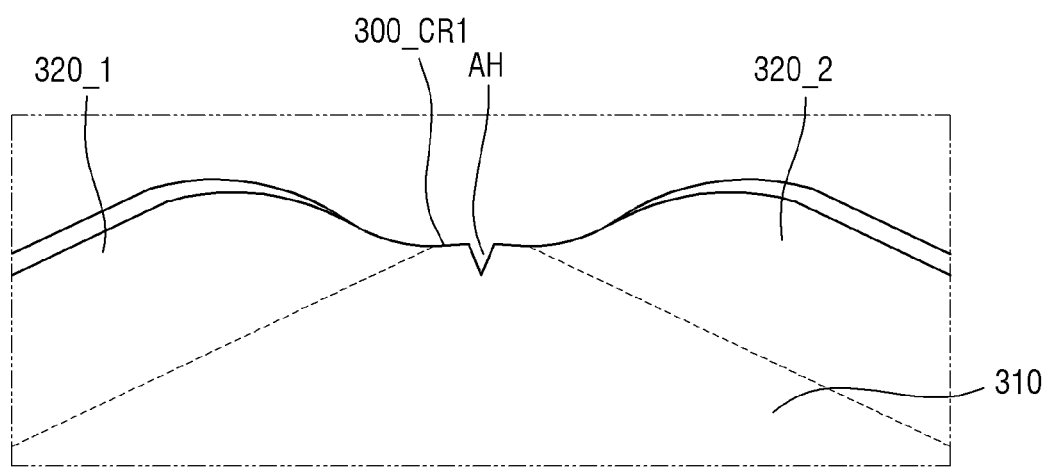
FIGS. 24A and 24B are enlarged perspective views of portion D of FIG. 23.
Figure 24B:
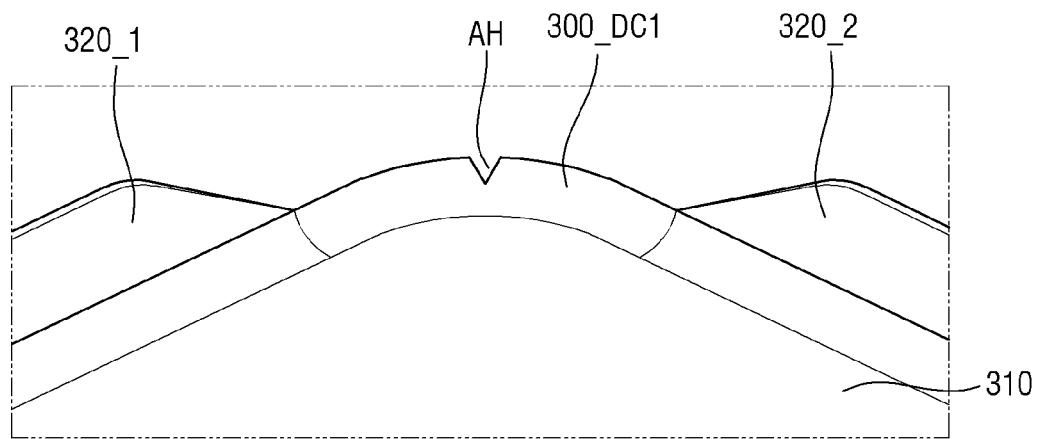
Figure 25:
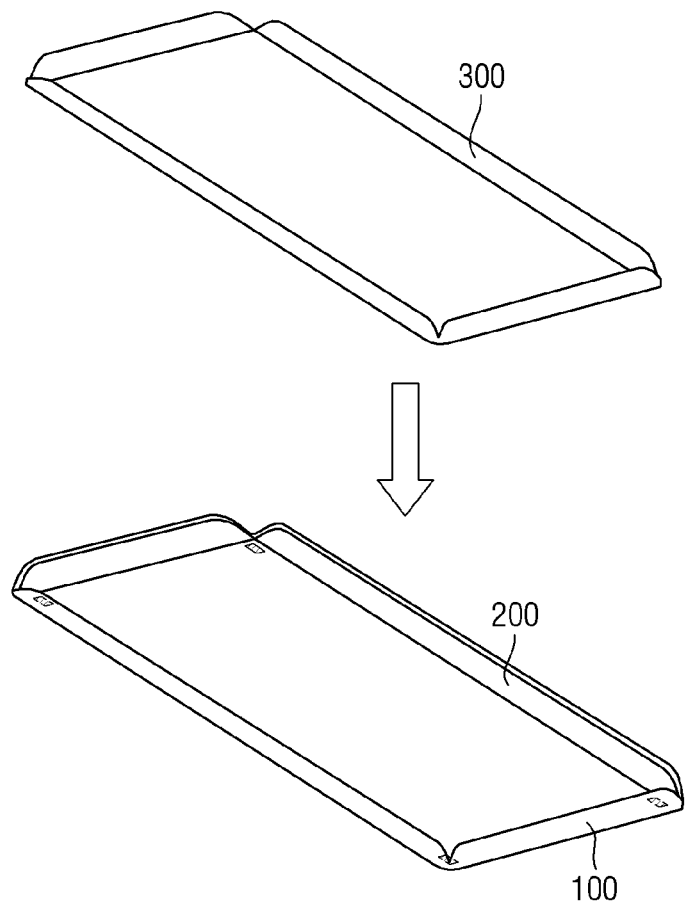
FIG. 25 is a view showing attaching a cover panel to a display panel.

FIG. 21 is a flowchart for illustrating a method for fabricating a display device according to an embodiment of the present disclosure. FIG. 22 is a view showing preparing a display panel and a cover panel. FIG. 23 is a view showing recognizing alignment marks of the display panel and alignment holes of the cover panel. FIGS. 24A and 24B are an enlarged perspective view of portion D of FIG. 23. FIG. 25 is a view showing attaching a cover panel to a display panel.

The display device fabricated by the method may include the embodiments of FIGS. 1 to 20.

Referring to FIG. 21, a method for fabricating a display device may include preparing a cover panel 300 including a front surface 310, a first side surface 320_1 connected to the front surface 310 and bent along a first bending line BL1, and a second side surface 320_2 connected to the front surface 310 and bent along a second bending line BL2 intersecting the first bending line BL1; recognizing an alignment notch AH formed at a corner between the first side surface 320_1 and the second side surface 320_2 of the cover panel 300; aligning the cover panel 300; and assembling the cover panel 300 and the display panel 200.

The method of fabricating the display device may further include recognizing alignment marks AM disposed at the corners of the display panel 200 after the preparing the cover panel 300. As shown in FIGS. 4 and 5, the display panel 200 may include the front surface 210, the first side surface 220_1 that connected to the front surface 210 and is bent along the first bending line BL1, the second side surface 220_2 that is connected to the front surface 210 and is bent along the second bending line BL2, the third side surface 220_3 that is connected to the front surface 210 and is bent along the third bending line BL3, and the fourth side surface 220_4 that is connected to the front surface 210 and is bent along the fourth bending line BL4.

The method of fabricating the display device may include bending the cover panel 300 before the preparing the cover panel 300. In some embodiments, the bending the cover panel 300 may be carried out simultaneously with the assembly of the display panel 200 and the cover panel 300.

The bending the cover panel 300 may further include bending both adjacent sides of the cover panel 300 to form the first side surface 320_1 and the second side surface 320_2.

The bending the cover panel 300 may include forming the third side surface 320_3 bent along the third bending line BL3 and the fourth side surface 320_4 bent along the fourth bending line BL4 intersecting the third bending line BL3. According to an embodiment of the present disclosure, the third bending line BL3 may be parallel to the first bending line BL1, and the fourth bending line BL4 may be parallel to the second bending line BL2.

The method for fabricating the display device is not limited to the above-described embodiment, and at least some of the above steps may be omitted, or one or more steps may be added with reference to the embodiments of FIGS. 1 to 20.

Hereinafter, a method for fabricating a display device will be described in detail with reference to FIGS. 22 to 25.

Referring to FIG. 22, the display panel 200 and the cover panel 300 may be prepared. According to an embodiment of the present disclosure, the four sizes of each of the cover window 100, the display panel 200 and the cover panel 300 may be bent. The display panel 200 may be attached to the cover window 100. The specific shapes of the cover window 100, the display panel 200 and the cover panel 300 have been described above with reference to FIGS. 1 to 19. In some embodiments, the cover panel 300 may be bent during the process of assembling the display panel 200 with it. Although not shown in the drawings, the display panel 200, the cover window 100 and the cover panel 300 may be mounted on a jig or a worktable that is movable and may be transferred. In some embodiments, the preparing the display panel 200 and the cover panel 300 may include separating a release paper or the like attached to protect the display panel 200 and/or the cover panel 300, etc.

Referring to FIGS. 23, 24A and 24B, after the preparing the display panel 200 and the cover panel 300, the alignment marks AM of the display panel 200 and/or the alignment notches AH of the cover panel 300 can be recognized by at least one camera. Specifically, at least one camera may capture the corners of the display panel 200 and the cover panel 300, and the alignment marks AM and/or the alignment notches AH may be recognized by a controller that processes the captured image. The camera may capture the alignment notches AH defined at the corners of the front surface 310 of the cover panel 300 as shown in FIG. 24A, or the alignment notches AH defined at the double curvature portions 300_DC1 of the cover panel 300 as shown in FIG. 24B. For example, the camera may capture all of the four corners of the display panel 200 and the cover panel 300, or only two or more corners thereof. In some embodiments, only a clearly recognized alignment notch AH among a plurality of recognized alignment notches AH may be selectively used. In some embodiments, the alignment notches AH may be defined only two of the four corners of the cover panel 300.

The camera may be placed on the rear surface of the display panel 200 and/or the cover panel 300. According to an embodiment of the present disclosure, at least one layer of the display panel 200 overlapping the alignment marks AM in the thickness direction, for example, the substrate SUB may include or be made of a transparent material. Accordingly, the alignment marks AM can be recognized even though the camera is placed on the rear surface of the display panel 200. In some embodiments, the alignment marks AM may be disposed directly on the rear surface of the display panel 200. In some embodiments, the camera may be disposed on the front and/or side surfaces of the display panel 200 and/or cover panel 300.

Referring to FIG. 24, after the alignment marks AM and/or the alignment notches AH are recognized, it may be determined whether the display panel 200 and/or the cover panel 300 are located at the correct position for assembly. For example, although not shown in the drawings, it may be determined whether the data stored previously coincides with the recognized alignment marks AM and/or alignment notches AH, etc. by the controller for controlling the cameras VC, so that the display panel 200 and/or the cover panel 300 are located at the correct positions.

It may be determined as to whether the display panel 200 and the cover panel 300 are located at the correct positions may be carried out based on a plurality of reference points set for the corners of the cover panel 300 and the display panel 200, respectively. The reference points of the cover panel 300 and the display panel 200 may be defined using the alignment notches AH and the alignment marks AM. For example, the determination as to whether the cover panel 300 and the display panel 200 are aligned correctly may be carried out using the positional relationship of the reference points of the display panel 200 relative to the reference points of the cover panel 300. The positional relationship may include distances in the first direction X and/or the second direction Y.

Referring to FIGS. 12 and 18, the reference points of the first corner 300_CR1 of the cover panel 300 may include a corner portion of a notch having a pointed shape that is dented toward the center of the cover panel 300. The corner portion of the notch may be disposed to overlap a reference line R' when viewed from the top. According to an embodiment of the present disclosure, the reference points of the cover panel 300 may include an intersection point of one side of the alignment notch AH extended in the first direction X and one side thereof extended in the second direction Y. The reference points may be respectively defined in the second corner 300_CR2, the third corner 300_CR3 and/or the fourth corner 300_CR4 of the cover panel 300 in substantially the same or similar manner as described above.

Referring to FIG. 8, the reference points of the first corner CR1 of the display panel 200 may be one of a plurality of alignment marks AM. The alignment marks AM may be those of the alignment mark AM which overlap the reference line R when viewed from the top. The reference lines R and R' may be substantially identical to each other. According to an embodiment of the present disclosure, the reference point of the first corner CR1 of the display panel 200 may be the alignment mark AM positioned farthest from the alignment notch AH. Referring to FIGS. 8 and 12, the reference point of the first corner CR1 of the display panel 200 may be the alignment mark AM positioned farthest from one side of the alignment notch AH extended in the first direction X and one side thereof extended in the second direction. The reference points may be respectively defined in the second corner CR2, the third corner CR3 and/or the fourth corner CR4 of the display panel 200 in substantially the same or similar manner as described above.

The determination as to whether the display panel 200 and the cover panel 300 are located at the correct positions may be carried out using virtual figures defined by the alignment notches AH and the alignment marks AM. The virtual figures may be derived from the above-described reference points. Specifically, four reference points of the cover panels 300 may be defined by four alignment notches AH which are defined at the four corners of the cover panel 300, respectively. A virtual first rectangle may be defined by using the four reference points of the cover panel 300. In addition, the four reference points of the cover panel 200 may be defined by the four alignment marks AM disposed at the four corners of the display panel 200, respectively. A virtual second rectangle may be defined by using the four reference points of the display panel 200. The controller may determine whether the display panel 200 and the cover panel 300 are aligned using the size, distance and/or positional relationship of the first rectangle and the second rectangle. In some embodiments, less than four reference points may be defined in each of the cover panel 300 and the display panel 200. If it is determined that the display panel 200 and/or the cover panel 300 are not located at the correct positions, the positions of the display panel 200 and/or the cover panel 300 may be aligned. For example, the positions of the display panel 200, the cover panel 300 and/or the elements that mount them (stage or work table, etc.) may be adjusted.

If it is determined that the display panel 200 and/or the cover panel 300 are located at the correct positions, the display panel 200 and/or the cover panel 300 may be moved to the positions for assembly. According to an embodiment of the present disclosure, the cover panel 300 may be moved. It is, however, to be understood that the present disclosure is not limited thereto. For example, the cover panel 300 may be attached to the display panel 200 by being pressed in the order of the front surface 310, the side surfaces 320 and the corners of the cover panel 300. The step of pressing the corners may be omitted.

Figure 26:
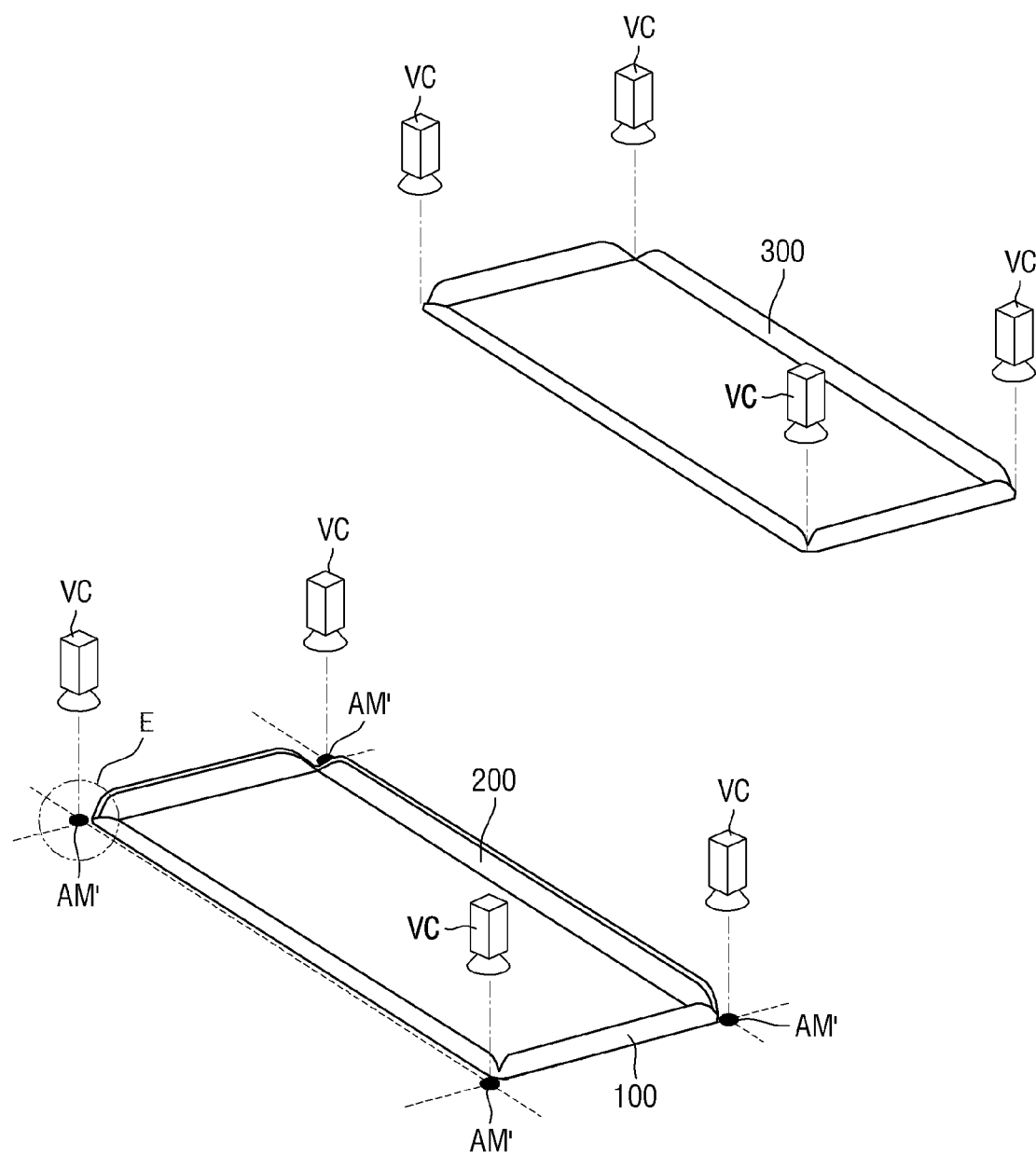
FIG. 26 is a view showing a method for fabricating a display device according to another embodiment of the present disclosure.
Figure 27:
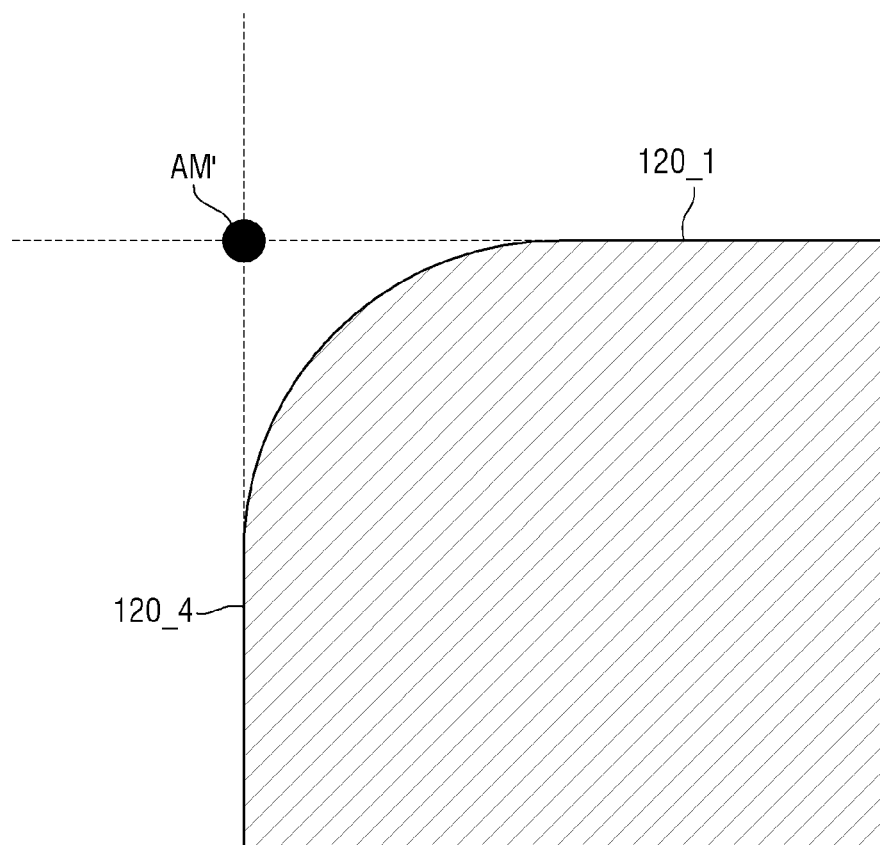
FIG. 27 is an enlarged plan view of portion E of FIG. 25.

FIG. 26 is a view showing a method for fabricating a display device according to another embodiment of the present disclosure. FIG. 27 is an enlarged plan view of portion E of FIG. 26.

The embodiment of FIG. 25 is different from the embodiment of FIG. 22 in that alignment marks AM of the window are recognized instead of the alignment marks AM of the display panel 200.

Referring to FIGS. 26 and 27, a method for fabricating a display device may further include recognizing virtual alignment marks AM' defined by the virtual extending lines of the cover window 100 having the display panel 200 attached thereto after preparing the display panel 200 and the cover panel 300. The cover window 100 may include a front surface 110 and a plurality of side surfaces 120 connected to the front surface 110 and bent in the thickness direction.

According to an embodiment of the present disclosure, the recognizing the virtual alignment marks AM' of the cover window 100 may be carried out instead of recognizing the alignment marks AM of the display panel 200. In some embodiments, the virtual alignment marks AM' of the cover window 100 may be recognized instead of the alignment marks AM of the display panel 200. According to an embodiment of the present disclosure, four virtual alignment marks AM' may be recognized adjacent to the four corners of the cover window 100, respectively. In some embodiments, only two virtual alignment marks AM' may be recognized.

Referring to FIG. 26, the virtual alignment marks AM' may be defined by the virtual extending lines of the cover window 100. For example, the virtual alignment marks AM' may be obtained through image processing performed by the controller based on the outer lines of the cover window 100 captured by the cameras VC.

According to an embodiment of the present disclosure, the virtual alignment marks AM' may be defined by the virtual extending lines of the side surfaces 320 of the cover window 100 recognized on a plane. The virtual alignment marks AM' may include the intersection point of a first virtual line and a second virtual line. The first virtual line may be a virtual line extended from the outer line of the first side surface 120_1 of the cover window 100, and may overlap the outer line of the first side surface 120_1 in the thickness direction when viewed from the top. The second virtual line may be a virtual line extended from the outer line of the second side surface 120_2 of the cover window 100 is extended, and may overlap the outer line of the second side surface 120_2 in the thickness direction when viewed from the top.

After the virtual alignment marks AM' and alignment notches AH are recognized, it may be determined whether the cover window 100, the display panel 200 and/or the cover panel 300 attached thereto are located at in the correct positions for assembly.

The determination as to whether the cover window 100 and the cover panel 300 are aligned may be carried out in a similar manner to that of the embodiment of FIG. 24. Specifically, the controller may set a plurality of reference points in each of the cover window 100 and the cover panel 300 based on the captured image data of the virtual alignment marks AM and the alignment notches AH. The plurality of reference points of the cover window 100 may include a plurality of virtual alignment marks AM. The controller may derive virtual figures respectively associated with the cover window 100 and the cover panel 300 based on the plurality of reference points. Then, it may determine whether the cover window 100 and the cover panel 300 are correctly aligned based on the positional relationship of the virtual figures. If it is determined that the cover window 100, the display panel 200 and/or the cover panel 300 are not located at the correct positions, the positions of the cover window 100, the display panel 200 and/or the cover panel 300 may be aligned.

If it is determined that the cover window 100, the display panel 200 and/or the cover panel 300 are located at the correct positions, the cover window 100, the display panel 200 and/or the cover panel 300 may be moved to positions for assembly to be assembled.

Figure 28:
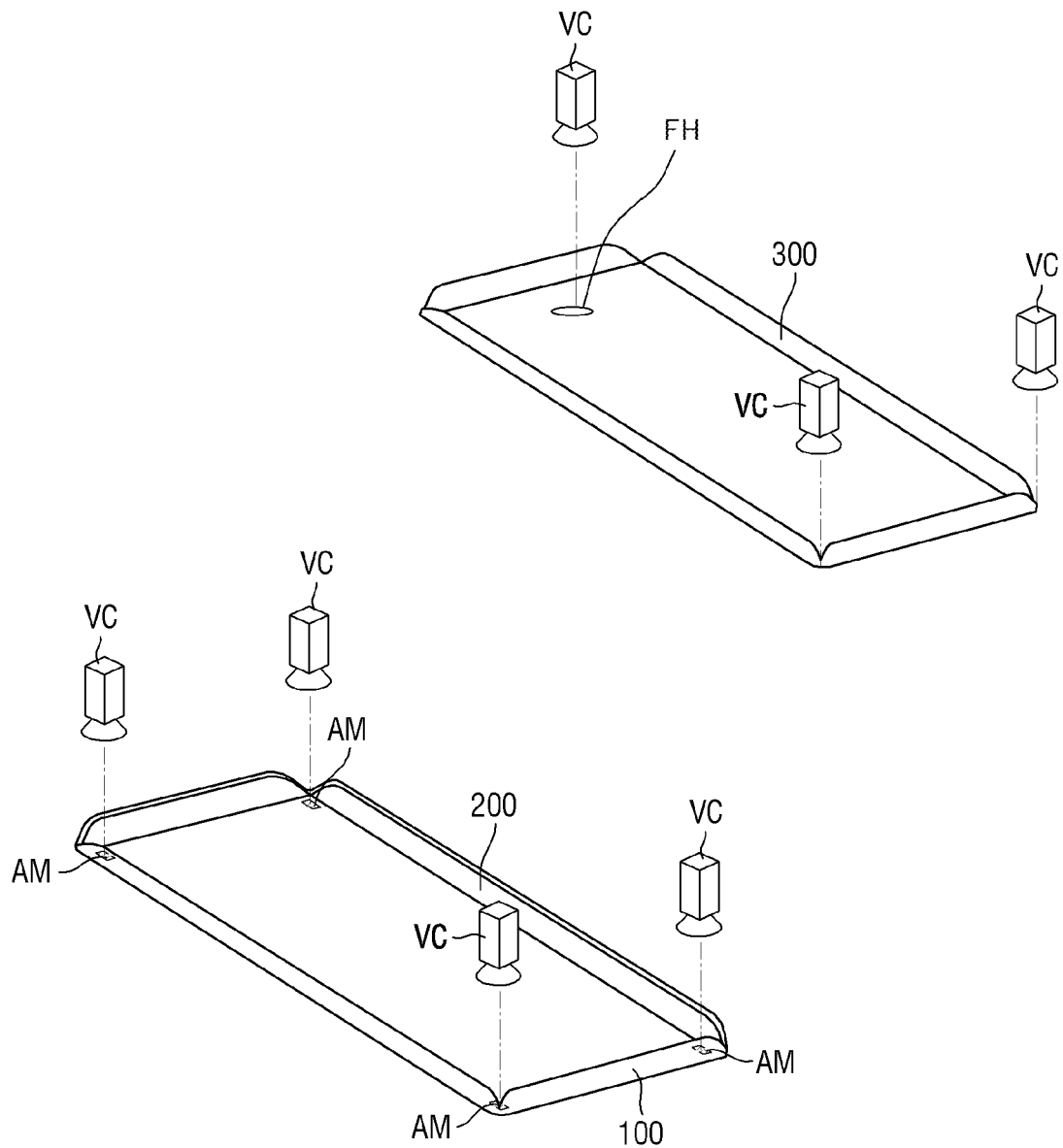
FIG. 28 is a view showing a method for fabricating a display device according to yet another embodiment of the present disclosure.

FIG. 28 is a view showing a method for fabricating a display device according to yet another embodiment of the present disclosure.

The embodiment of FIG. 28 is different from the embodiment of FIG. 24 in that the cover panel 300 may be aligned based on alignment holes FH.

Referring to FIG. 28, a method for fabricating a display device may further include recognizing alignment holes FH defined in the front surface of the cover panel 300 after preparing the display panel 200 and the cover panel 300. The method according to this embodiment may include aligning the cover panel 300 using the alignment notches AH and the alignment holes FH defined at at least three points, unlike the embodiments of FIG. 24 or 26.

The determination as to whether the display panel 200 and the cover panel 300 are aligned may be carried out in a similar manner to that of the embodiment of FIG. 24. Specifically, the controller may set a plurality of reference points in each of the display panel 200 and the cover panel 300 based on the captured image data of the alignment marks AM, the alignment holes FH and the alignment notches AH. The controller may derive virtual figures respectively associated with the display panel 200 and the cover panel 300 based on the plurality of reference points. Then, it may determine whether the cover window 200 and the cover panel 300 are correctly aligned based on the positional relationship of the virtual figures. In some embodiments, the virtual alignment marks AM' may be used.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
a display panel comprising a display area and a non-display area surrounding the display area; and
a cover panel disposed on a rear surface of the display panel and comprising a front surface, a first side surface connected to the front surface and bent along a first bending line, a second side surface connected to the front surface and bent along a second bending line intersecting the first bending line, and a first corner located between the first side surface and the second side surface,
wherein an alignment notch is defined at an outer end of the first corner of the cover panel in a plan view, and the display panel covers an entirely of the alignment notch in the plan view.

2. The display device of claim 1, wherein the alignment notch is defined to overlap the non-display area of the display panel in a thickness direction.

3. The display device of claim 2, wherein the cover panel further comprises an alignment hole defined in the front surface.

4. The display device of claim 2, wherein the display panel further comprises an alignment mark disposed in the non-display area.

5. The display device of claim 4, wherein the cover panel is smaller than the display panel, and wherein an edge of the cover panel is disposed to overlap the non-display area of the display panel in the plan view.

6. The display device of claim 5, wherein the edge of the cover panel is disposed further inside the display panel than the alignment mark in the plan view.

7. The display device of claim 4, wherein a size of the alignment mark is smaller than a size of the alignment notch in a plan view.

8. The display device of claim 4, wherein the alignment mark is disposed at a corner of the display panel.

9. The display device of claim 1, wherein the alignment notch is defined across the first bending line and the second bending line.

10. The display device of claim 1, wherein the alignment notch is defined in a center area of the first corner of the cover panel.

11. The display device of claim 10, wherein the center area of the first corner comprises a corner of the front surface of the cover panel.

12. The display device of claim 1, wherein the alignment notch is bent in a thickness direction.

13. The display device of claim 1, wherein the first corner comprises a first double curvature portion curved with two or more curvatures, and wherein the alignment notch is defined at the first double curvature portion.

14. The display device of claim 13, where the first corner comprises a first cutting line disposed between the first side surface and the first double curvature portion and a second cutting line disposed between the second side surface and the first double curvature portion, and wherein the alignment notch is defined between the first cutting line and the second cutting line.

15. The display device of claim 1, wherein the cover panel further comprises a polymer film layer, a cushion member, and a heat dissipation member which are sequentially stacked on the rear surface of the display panel.

16. The display device of claim 15, wherein the cover panel further comprises a first coupling member disposed between the display panel and the polymer film layer, a second coupling member disposed between the polymer film layer and the cushion member, and a third coupling member disposed between the cushion layer and the heat dissipation member.

17. The display device of claim 1, wherein the cover panel further comprises: a third side surface connected to the front surface and bent along a third bending line, and a fourth side surface connected to the front surface and bent along a fourth bending line.

18. A display device comprising:
a display panel comprising a display area and a non-display area surrounding the display area;
a cover panel disposed on a rear surface of the display panel and comprising a front surface, a first side surface connected to the front surface and bent along a first bending line, a second side surface connected to the front surface and bent along a second bending line intersecting the first bending line, and a first corner located between the first side surface and the second side surface; and
an alignment notch defined at the first corner of the cover panel,
wherein the cover panel is smaller than the display panel, and
wherein an edge of the cover panel is disposed to overlap the non-display area of the display panel in a plan view.

\* \* \* \* \*